(12) United States Patent
Kinoshita

(10) Patent No.: US 11,631,765 B2
(45) Date of Patent: Apr. 18, 2023

(54) METHOD OF MANUFACTURING INSULATED GATE SEMICONDUCTOR DEVICE WITH INJECTION SUPPRESSION STRUCTURE

(71) Applicant: Fuji Electric Co., Ltd., Kanagawa (JP)

(72) Inventor: Akimasa Kinoshita, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 158 days.

(21) Appl. No.: 17/135,682

(22) Filed: Dec. 28, 2020

(65) Prior Publication Data

US 2021/0119040 A1 Apr. 22, 2021

Related U.S. Application Data

(62) Division of application No. 16/269,344, filed on Feb. 6, 2019, now Pat. No. 10,937,901.

(30) Foreign Application Priority Data

Mar. 14, 2018 (JP) .............................. JP2018-047155

(51) Int. Cl.
*H01L 29/78* (2006.01)
*H01L 29/423* (2006.01)
(Continued)

(52) U.S. Cl.
CPC ...... *H01L 29/7813* (2013.01); *H01L 29/0852* (2013.01); *H01L 29/1095* (2013.01);
(Continued)

(58) Field of Classification Search
CPC ............. H01L 29/7813; H01L 29/7825; H01L 29/66613–66628; H01L 29/42336;
(Continued)

(56) References Cited

U.S. PATENT DOCUMENTS

2017/0110571 A1 4/2017 Kobayashi et al.
2017/0373180 A1* 12/2017 Haeberlen ........... H01L 29/0834
2019/0172910 A1 6/2019 Siemieniec et al.

FOREIGN PATENT DOCUMENTS

JP 5614399 B2 10/2014
JP 2017-79251 A 4/2017
JP 6168370 B2 7/2017

* cited by examiner

*Primary Examiner* — Nelson Garces
(74) *Attorney, Agent, or Firm* — Chen Yoshimura LLP

(57) ABSTRACT

A method of manufacturing an insulated gate semiconductor device includes simultaneously forming a gate trench and a contact trench that respectively penetrate form a top of the electrode contact region through a main electrode contact region and a injection control region in a depth direction and respectively reach a charge transport region, the contact trench being disposed at a position laterally separated from the gate trench in a plan view; and embedding a gate electrode inside the gate trench with a gate insulating film interposed therebetween, thereby forming an insulated gate structure, and simultaneously embedding an injection suppression region inside the contact trench, the gate electrode and the injection suppression region being both made of a second semiconductor material having a narrower bandgap than a bandgap of the first semiconductor material of the charge transport region.

2 Claims, 22 Drawing Sheets

(51) Int. Cl.
*H01L 29/66* (2006.01)
*H01L 29/16* (2006.01)
*H01L 29/08* (2006.01)
*H01L 29/10* (2006.01)

(52) U.S. Cl.
CPC ...... *H01L 29/1608* (2013.01); *H01L 29/4236* (2013.01); *H01L 29/66734* (2013.01); *H01L 29/7804* (2013.01)

(58) Field of Classification Search
CPC ........... H01L 29/42352; H01L 29/4236; H01L 29/7804; H01L 29/7392; H01L 29/7397; H01L 29/0623; H01L 29/063–0634
See application file for complete search history.

METHOD OF MANUFACTURING INSULATED GATE SEMICONDUCTOR DEVICE WITH INJECTION SUPPRESSION STRUCTURE

BACKGROUND OF THE INVENTION

Technical Field

The present invention relates to an insulated gate semiconductor device having a trench gate structure and a method of manufacturing the same.

Background Art

A vertical MIS field effect transistor (FET) has a built-in parasitic pn diode (body diode) formed of an n-type drift region and a p-type base region. In the case of a MISFET (SiC-MISFET) using silicon carbide (SiC) as the material, the built-in potential of the body diode is higher than if silicon were used as the material, and thus ON resistance becomes higher and loss increases. Furthermore, when the body diode is ON and conductive, characteristic degradation occurs due to the bipolar operation of the body diode, thus decreasing reliability.

In order to suppress the bipolar operation of the body diode of the SiC-MISFET, a structure has been proposed in which the MIS transistor structure includes a barrier-forming layer that forms, by being in contact with the drift region, a junction barrier that is joined to the drift region and that has a lower diffusion potential than the body diode formed by the pn junction of the body region and drift region (see Patent Document 1). A structure has also been proposed in which a source electrode embedded inside a contact trench contacts a p-type semiconductor region at the bottom and corner sections of the contact trench, and a Schottky junction with an n-type drift region is formed on the side wall of the contact trench (see Patent Document 2). Furthermore, a structure has been proposed in which a groove in a semiconductor substrate has a heterojunction made of a semiconductor material with a differing bandgap from the semiconductor substrate (see Patent Document 3).

RELATED ART DOCUMENTS

Patent Documents

Patent Document 1: Japanese Patent No. 6168370
Patent Document 2: Japanese Patent Application Laid-Open Publication No. 2017-79251
Patent Document 3: Japanese Patent No. 5614399

SUMMARY OF THE INVENTION

However, in Patent Document 1, the polysilicon forming the barrier-forming layer is exposed to the drift region due to being in contact with the drift region, and thus it is easy for electric fields to be applied to the polysilicon, which has weak electric field strength. In addition, there are many manufacturing steps due to the polysilicon forming the barrier-forming layer being formed separately from the gate electrode. Furthermore, in Patent Document 2, the Schottky junction diode has a higher ON resistance than a heterojunction diode. Moreover, in Patent Document 3, no consideration is given to a contact trench for embedding the source electrode.

In view of the aforementioned problems, the present invention aims at providing an insulated gate semiconductor device and a method of manufacturing the same that can suppress bipolar operation of a body diode, has a low ON resistance and a high withstand voltage, and can increase reliability.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides an insulated gate semiconductor device, including: (a) a charge transport region made of a first semiconductor material of a first conductivity type that transports majority carriers serving as main current; (b) an injection control region made of the first semiconductor material of a second conductivity type that is provided on the charge transport region and controls an amount of the majority carriers injected into the charge transport region; (c) a main electrode contact region made of the first semiconductor material of the first conductivity type that is provided on the injection control region and has a higher impurity concentration than the charge transport region; (d) an insulated gate electrode structure that has a gate trench vertically penetrating from a top of the main electrode contact region through the main electrode contact region and the injection control region in a depth direction and reaching the charge transport region, and a gate electrode embedded in the trench with a gate insulating film interposed between the gate electrode and the trench, the insulated gate electrode structure controlling a surface potential of the injection control region so as to control the amount of the majority carriers injected into the charge transport region; (e) an injection suppression structure that has a contact trench penetrating from the top of the main electrode contact region through the main electrode contact region and the injection control region in the depth direction and reaching the charge transport region, and an injection suppression region filling in the trench, the injection suppression structure being disposed at a position laterally separated from the insulating gate structure in a plan view, the injection suppression region including a second semiconductor material having a narrower bandgap than a bandgap of the first semiconductor material of the charge transport region; and (f) a contact protection region made of the first semiconductor material of the second conductivity type that is embedded inside the charge transport region so as to contact at least a portion of a bottom of the injection suppression region including the second semiconductor material having the narrower bandgap, the contact protection region having a higher impurity concentration than an impurity concentration in the injection control region.

In another aspect, the present disclosure provides a method of manufacturing an insulated gate semiconductor device, the method including: (a) forming an injection control region made of a first semiconductor material of a second conductivity type on a charge transport region made of the first semiconductor material of a first conductivity type; (b) forming a main electrode contact region made of the first semiconductor material of the first conductivity type on the injection control region at a higher impurity concentration than the charge transport region; (c) simultaneously forming a gate trench and a contact trench that respectively penetrate form a top of the electrode contact region through the main electrode contact region and the injection control region in a depth direction and respectively reach the charge transport region, the contact trench being disposed at a position laterally separated from the gate trench in a plan view; (d) forming a gate insulating film inside the gate trench; (e) embedding a gate electrode inside the gate trench with the gate insulating film interposed therebetween, thereby forming an insulated gate structure, and simultaneously embedding an injection suppression region inside the contact trench, the gate electrode and the injection suppression region being both made of a second semiconductor material having a narrower bandgap than a bandgap of the first semiconductor material of the charge transport region; and (f) forming a main electrode layer on a top surface of the main electrode contact region and on a top surface of the injection suppression region.

The present invention makes it possible to provide an insulated gate semiconductor device and a method of manufacturing the same that can suppress bipolar operation of a body diode, has a low ON resistance and a high withstand voltage, and can increase reliability.

It is to be understood that both the foregoing general description and the following detailed description are exemplary and explanatory, and are intended to provide further explanation of the invention as claimed.

DETAILED DESCRIPTION OF EMBODIMENTS

Figure 1:
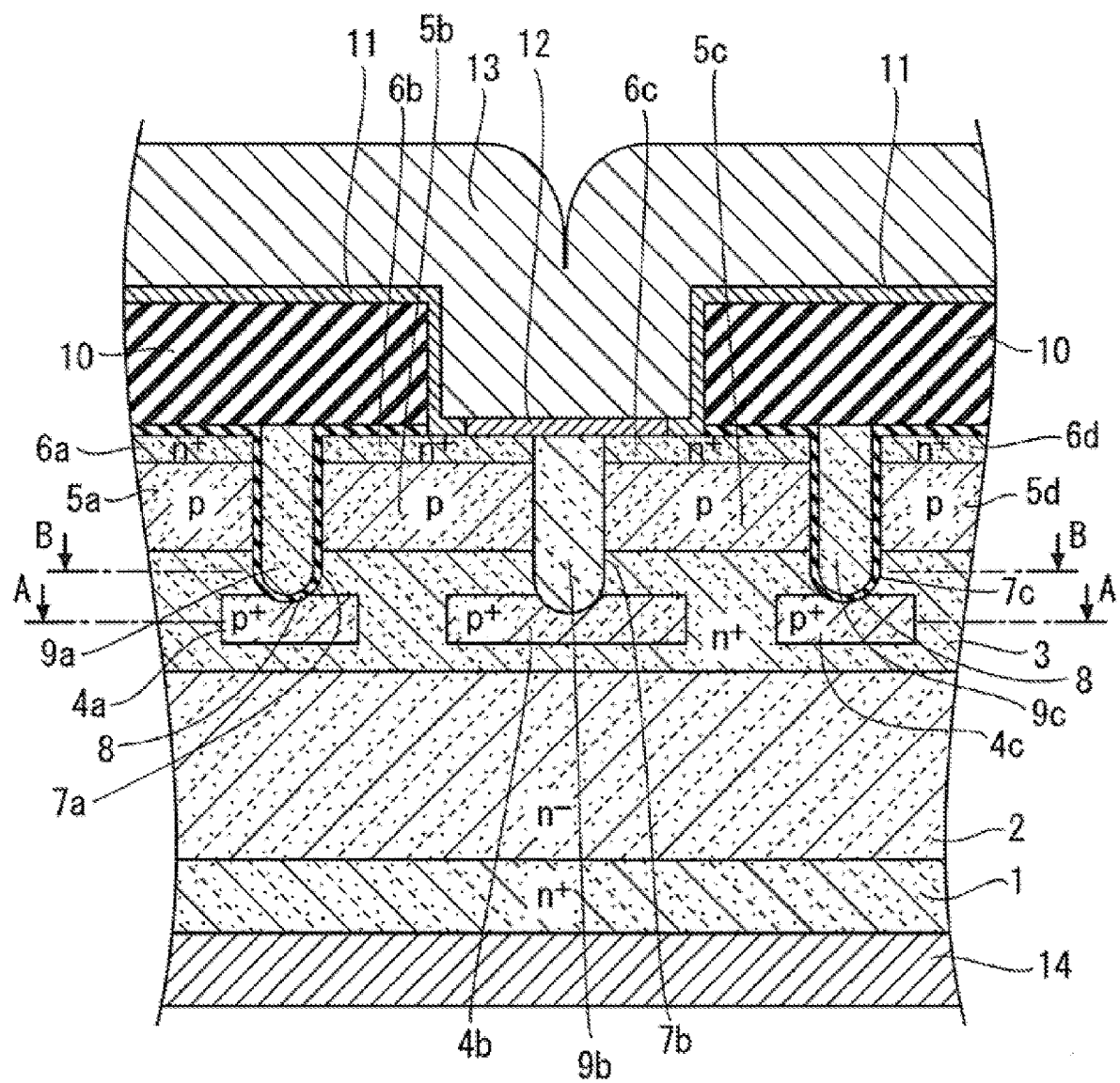
FIG. 1 is a cross-sectional view of main parts of one example of an insulated gate semiconductor device according to Embodiment 1 of the present invention.

Embodiments 1 to 4 of the present invention will be described with reference to the drawings. In the drawings, portions that are the same or similar will be assigned the same or similar reference characters and redundant explanations will be omitted. However, the drawings are schematic, and the relationship between thickness and planar dimensions, the ratio of the thicknesses of layers, etc. may differ in practice. Furthermore, there can be parts for which the relationship between dimensions, ratios, etc. differ even among the drawings. Embodiments 1 to 4 shown below illustratively indicate a device and method for carrying out the technical idea of the present invention, and the technical idea of the present invention is not limited to the material, shape, structure, arrangement, etc. of the constituent components described below.

In the present specification, the "one main electrode region" or "main electrode contact region" of the insulated gate semiconductor device means, in a field effect transistor (FET) or static induction transistor (SIT), a semiconductor region serving as either a source region or a drain region. In an insulated gate bipolar transistor (IGBT), "one main electrode region" means a semiconductor region serving as either an emitter region or a collector region. In an insulated gate thyristor such as a MIS controlled static induction thyristor (SI thyristor), "one main electrode region" means a semiconductor region serving as either an anode region or a cathode region. The "other main electrode region" means, in a FET or SIT, a semiconductor region serving as whichever of the source region or drain region that is not the one main electrode region. In an IGBT, "other main electrode region" means a region serving as whichever of the emitter region or collector region that is not the one main electrode region. In a MIS control SI thyristor or the like, "other main electrode region" means a semiconductor region serving as whichever of the anode region or cathode region that is not the one main electrode region.

Thus, if the "one main electrode region" is the source region, then the "other main electrode region" means the drain region, and "main current" flows between the one main electrode region and the other main electrode region. If the "one main electrode region" is the emitter region, then the "other main electrode region" means the collector region. If the "one main electrode region" is the anode region, then the "other main electrode region" means the cathode region. If the bias relationship is interchanged, then in the case of a MISFET or the like, the function of the "one main electrode region" and the function of the "other main electrode region" may be interchangeable. Furthermore, in the present specification, when merely a "main electrode region" is described, this is a comprehensive expression that means a semiconductor region of whichever of the one main electrode region or other main electrode region that is technically suitable. Similarly, in the present specification, when merely a "main electrode layer" is described, this is a comprehensive expression that means a conductor layer of either the "one main electrode layer" connected to the one main electrode region or the "other main electrode layer" connected to the other main electrode region.

Further, in the description below, the first conductivity type is illustratively described as n-type and the second conductivity as p-type. However, an inverse relationship may be selected for the conductivity types, where the first conductivity type is p-type and the second conductivity type is n-type. A "+" or "−" attached to an "n" or "p" signifies that the impurity concentration is higher or lower, respectively, for the semiconductor region than a semiconductor region not having the "+" or "−". However, this does not mean that semiconductor regions that are both labelled "n" have exactly the same impurity concentrations.

The definition of directions such as up-down in the description below are merely definitions for convenience of explanation and do not limit the technical idea of the present invention. For example, if an object is observed after being rotated 90°, up-down is converted to left-right, and if observed after being rotated 180°, up-down is inversed.

Embodiment 1

As shown in FIG. 1, an insulated gate semiconductor device (MISFET) according to Embodiment 1 of the present invention includes a first conductivity type (n-type) charge transport region (2, 3) that transports majority carriers. The charge transport region (2, 3) is made of a two-layer structure of an n⁻ drift layer 2 and an n-type current spreading layer (CSL) 3 disposed on the drift layer 2. The drift layer 2 is a semiconductor region capable of transporting the majority carriers injected into the drift layer 2 via a drift electric field. Depending on the design specifications, the current spreading layer 3 need not be provided on the drift layer 2. The impurity concentration of the drift layer 2 is, for example, not less than about $1 \times 10^{15}$ cm$^{-3}$ and not more than about $1 \times 10^{18}$ cm$^{-3}$, and the impurity concentration of the current spreading layer 3 is, for example, not less than about $5 \times 10^{16}$ cm$^{-3}$ and not more than about $5 \times 10^{17}$ cm$^{-3}$.

Injection control regions (base regions) 5a, 5b, 5c, 5d of a second conductivity type (p-type) are provided on the charge transport region (2, 3). The injection control regions 5a, 5b, 5c, 5d control the amount of majority carriers injected into the charge transport region (2, 3). The impurity concentration of the injection control regions 5a, 5b, 5c, 5d is, for example, not less than about $1 \times 10^{15}$ cm$^{-3}$ and not more than about $7 \times 10^{17}$ cm$^{-3}$.

N-type main electrode regions (source regions) 6a, 6b, 6c, 6d serving as the "one main electrode regions" are provided on the injection control regions 5a, 5b, 5c, 5d. The main electrode regions 6a, 6b, 6c, 6d are n-type semiconductor regions with a higher concentration than the charge transport region (2, 3). The impurity concentration of the main electrode regions 6a, 6b, 6c, 6d is, for example, not less than about $1 \times 10^{18}$ cm$^{-3}$ and not more than about $1 \times 10^{21}$ cm$^{-3}$. In the case where the main electrode regions 6a, 6b, 6c, 6d are n-type, the majority carriers serving as the main current are electrons.

The insulated gate semiconductor device according to Embodiment 1 further includes insulated gate electrode structures (8, 9a), (8, 9c), and an injection suppression region 9b provided in a position separated from the insulated gate electrode structures (8, 9a), (8, 9c). The insulated gate electrode structures (8, 9a), (8, 9c) electrostatically control the surface potential of the injection control regions 5a, 5b, 5c, 5d to control the amount of majority carriers injected into the charge transport region (2, 3).

The insulated gate electrode structures (8, 9a), (8, 9c) are provided in the depth direction going through the injection control regions 5a, 5b, 5c, 5d from the top surface side of the main electrode regions 6a, 6b, 6c, 6d. In other words, the insulated gate electrode structures (8, 9a), (8, 9c) are embedded inside gate trenches 7a, 7b provided in the depth direction going through the injection control regions 5a, 5b, 5c, 5d from the top surface side of the main electrode regions 6a, 6b, 6c, 6d.

The insulated gate electrode structure (8, 9a) has a gate insulating film 8 provided on the bottom surface and side surfaces of the gate trench 7a, and a gate electrode 9a embedded inside the gate trench 7a with the gate insulating film 8 interposed therebetween. The insulated gate electrode structure (8, 9c) has a gate insulating film 8 provided on the bottom surface and side surfaces of the gate trench 7c, and a gate electrode 9c provided inside the gate trench 7c with the gate insulating film 8 interposed therebetween.

The gate insulating film 8 can be a single layer film of any one of a silicon oxide film (SiO₂ film), silicon oxynitride (SiON) film, strontium oxide (SrO) film, silicon nitride (Si$_3$N$_4$) film, aluminum oxide (Al$_2$O$_3$) film, magnesium oxide (MgO) film, yttrium oxide (Y$_2$O$_3$) film, hafnium oxide (HfO$_2$) film, zirconium oxide (ZrO$_2$) film, tantalum oxide (Ta$_2$O$_5$) film, and bismuth oxide (Bi$_2$O$_3$) film, or a composite film in which a plurality of these films are laminated, or the like.

The injection suppression region 9$b$ is provided in the depth direction going through the injection control regions 5$b$, 5$c$ from the top surface position of the main electrode regions 6$b$, 6$c$ at a position separated from the insulated gate electrode structures (8, 9$a$), (8, 9$c$). In other words, the injection suppression region 9$b$ is embedded inside the contact trench 7$b$ provided in the depth direction going through the injection control regions 5$b$, 5$c$ from the top surface position of the main electrode regions 6$b$, 6$c$. The injection suppression region 9$b$ includes a semiconductor material with a narrower bandgap than the material of the charge transport region (2, 3) and forms a heterojunction pn junction (p-n heterojunction) in a path leading to the charge transport region (2, 3). The forming of the p-n heterojunction by the injection suppression region 9$b$ suppresses the injection of minority carriers into the charge transport region (2, 3) from the injection suppression region 9$b$.

In Embodiment 1, the injection suppression region 9$b$ is made of a semiconductor material with a narrower bandgap than the material forming the current spreading layer 3 and forms a heterojunction with the current spreading layer 3. The p-n heterojunction of the p$^+$ injection suppression region 9$b$ and the n$^+$ current spreading layer 3 forms a diode. In a case where the injection control regions 5$a$, 5$b$, 5$c$, 5$d$ are provided on the drift layer 2 without providing the current spreading layer 3, a diode may be formed by the p-n heterojunction of the p$^+$ injection suppression region 9$b$ and the n$^-$ drift layer 2.

The drift layer 2, the current spreading layer 3, a contact protection region 4$b$, the injection control regions 5$a$, 5$b$, 5$c$, 5$d$, the main electrode regions 6$a$, 6$b$, 6$c$, 6$d$, etc., can each be formed of SiC, for example. In this case, the material of the injection suppression region 9$b$ can be a polysilicon layer (doped polysilicon layer) to which a p-type impurity such as aluminum (Al) or boron (B), for example, has been added at a high concentration of not less than about $1 \times 10^{19}$ cm$^{-3}$ and not more than about $1 \times 10^{21}$ cm$^{-3}$. In addition to a doped polysilicon layer (DOPOS layer), the material of the injection suppression region 9$b$ can be single crystal silicon or amorphous silicon to which a high concentration of impurities has been added. In a case where the current spreading layer 3 is made of 4H-SiC, for example, the material of the gate electrodes 9$a$, 9$c$, and injection suppression region 9$b$ may be germanium (Ge) or may be 3C—SiC. The bandgap of 4H—SiC at 300 K is 3.26 eV, but the bandgap of 3C—SiC at 300 K is 2.36 eV. For convenience of explanation, the injection suppression region 9$b$ will be hypothesized as a p$^+$ DOPOS layer below.

The material of the gate electrodes 9$a$, 9$c$ and injection suppression region 9$b$ may be the same as one another or may be different from one another, but in order to simplify the manufacturing process, it is preferable that the material of the gate electrodes 9$a$, 9$c$ and injection suppression region 9$b$ be the same as one another. The material of the gate electrodes 9$a$, 9$c$ is the same p$^+$ DOPOS layer as the injection suppression region 9$b$, for example, but may be single crystal silicon or amorphous silicon to which a high concentration of impurities have been added, or may be Ge or 3C—SiC.

The width and depth of the insulated gate electrode structures (8, 9$a$), (8, 9$c$) and the width and depth of the injection suppression region 9$b$ may be substantially the same as one another. The width of the insulated electrode structures (8, 9$a$), (8, 9$c$) and injection suppression region 9$b$ is not less than about 0.5 µm and not more than about 1.5 µm, for example. The width and depth of the insulated gate electrode structures (8, 9$a$), (8, 9$c$) and the width and depth of the injection suppression region 9$b$ may differ from one another. Furthermore, a case is illustratively shown in which the insulated gate electrode structures (8, 9$a$), (8, 9$c$) and injection suppression region 9$b$ are arrayed at equal intervals, but the intervals of the insulated gate electrode structures (8, 9$a$), (8, 9$c$) and injection suppression region 9$b$ may differ from one another.

P$^+$ gate protection regions 4$a$, 4$c$ respectively contact the bottom surfaces of the insulated gate electrode structures (8, 9$a$), (8, 9$c$). The gate protection regions 4$a$, 4$c$ are separated in the depth direction from the injection control regions 5$a$, 5$b$, 5$c$, 5$d$ and provided inside the charge transport region (2, 3). The gate protection regions 4$a$, 4$c$ are p-type semiconductor regions with a higher concentration than the injection control regions 5$a$, 5$b$, 5$c$, 5$d$. The gate protection regions 4$a$, 4$c$ function to protect the gate insulating film 8 positioned at the bottom of the insulated gate electrode structures (8, 9$a$), (8, 9$c$) from high voltages during reverse bias.

The p-type contact protection region 4$b$ contacts the bottom surface of the injection suppression region 9$b$. The contact protection region 4$b$ is separated in the depth direction from the injection control regions 5$a$, 5$b$, 5$c$, 5$d$ and provided inside the charge transport region (2, 3). The contact protection region 4$b$ is a p-type semiconductor region with a higher concentration than the injection control regions 5$a$, 5$b$, 5$c$, 5$d$. The contact protection region 4$b$ functions to protect the bottom surface of the injection suppression region 9$b$ from high voltages during reverse bias.

In FIG. 1, a case is illustratively shown where the width of the contact protection region 4$b$ is wider than the width of the gate protection regions 4$a$, 4$c$, but the width of the contact protection region 4$b$ may be the same as the width of the gate protection regions 4$a$, 4$c$, or the width of the contact protection region 4$b$ may be narrower than the width of the gate protection regions 4$a$, 4$c$. In a case where the injection control regions 5$a$, 5$b$, 5$c$, 5$d$ are provided on the drift layer 2 without providing the current spreading layer 3, the gate protection regions 4$a$, 4$c$, and contact protection region 4$b$ may be provided on the drift layer 2.

Figure 2:
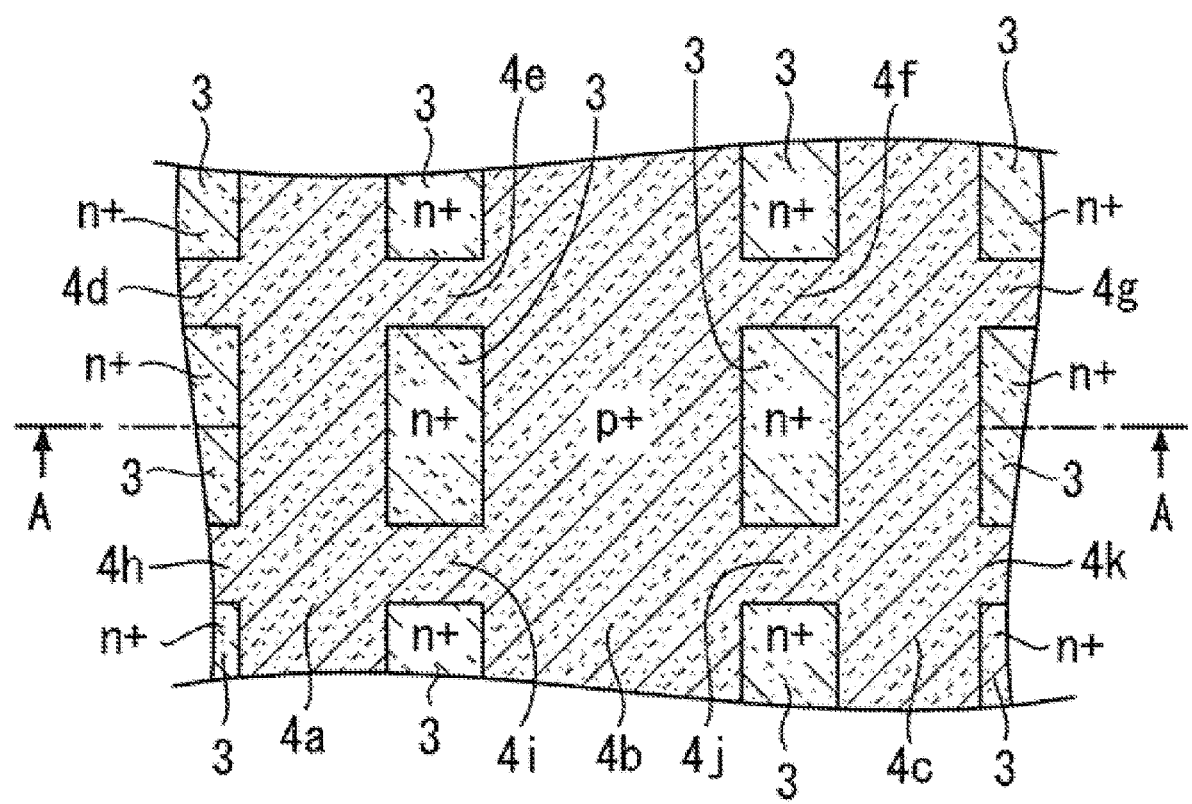
FIG. 2 is a cross-sectional view in the horizontal direction of the insulated gate semiconductor device seen from the A-A direction of FIG. 1.

FIG. 2 shows a planar layout seen from the A-A direction horizontally cutting through the gate protection regions 4$a$, 4$c$ and contact protection region 4$b$ of FIG. 1. The cross-sectional view seen from the A-A direction of FIG. 2 corresponds to FIG. 1. As shown in FIG. 2, disposed on the left-side position of a vertical-direction pattern formed by the gate protection region 4$a$ are p$^+$ connection regions 4$d$, 4$h$ connected to each other as protrusions from the gate protection region 4$a$ pattern, thus forming a grid pattern (a checkered pattern). Between the gate protection region 4$a$ and contact protection region 4$b$, p$^+$ connection regions 4$e$, 4$i$ are disposed and connected so as to form a checkered pattern with the gate protection region 4$a$ and contact protection region 4$b$ among the pattern of the current spreading layer 3.

Between the contact protection region 4$b$ and gate protection region 4$c$, p$^+$ connection regions 4$f$, 4$j$ connected to the contact protection region 4$b$ and gate protection region 4$c$ are disposed to form a grid pattern. Disposed on the right-side position of a vertical-direction pattern formed by the gate protection region 4$c$ are p$^+$ connection regions 4$g$, 4k connected to each other as protrusions from the gate protection region 4c pattern, thus forming a grid pattern.

Figure 3:
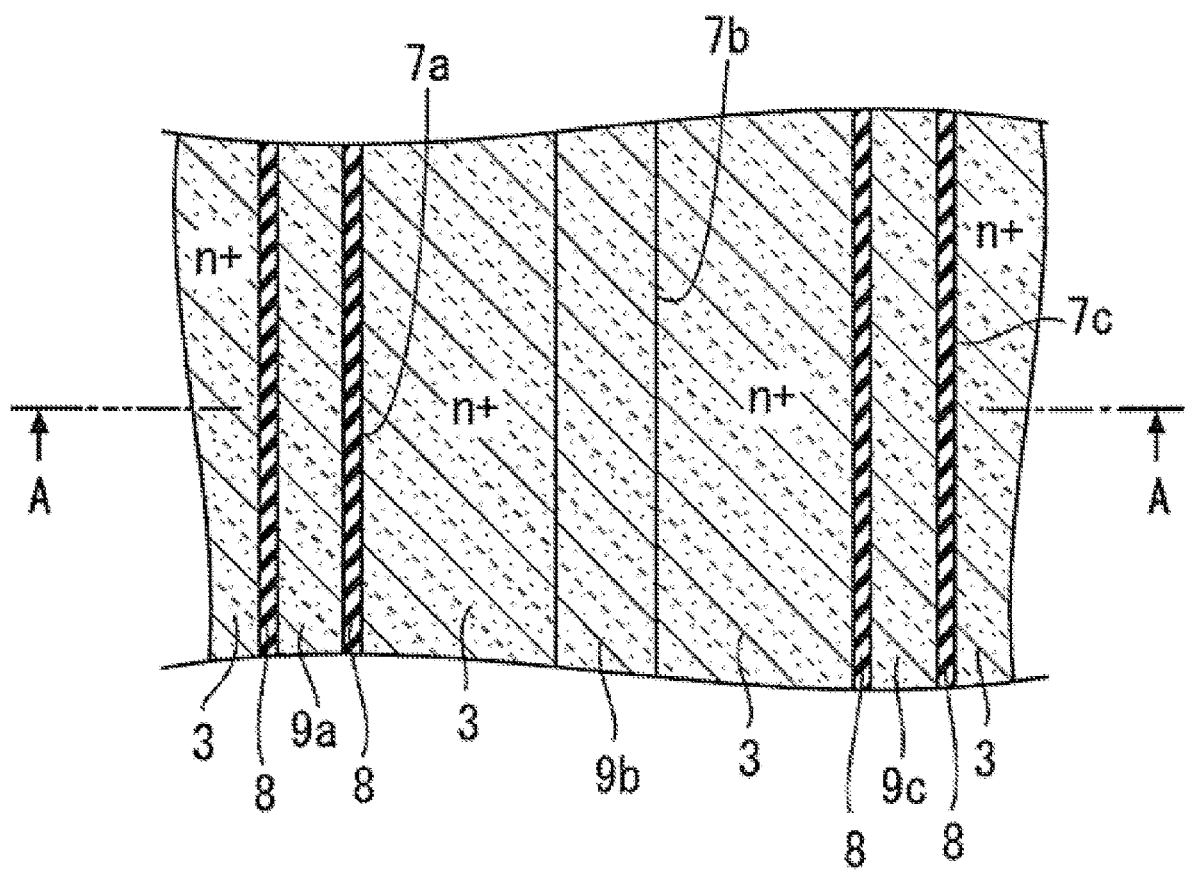
FIG. 3 is a cross-sectional view in the horizontal direction of the insulated gate semiconductor device seen from the B-B direction of FIG. 1.

FIG. 3 shows a planar layout seen from the B-B direction horizontally cutting through the sections in FIG. 1 of the portion where the side surfaces of the insulated gate electrode structures (8, 9a), (8, 9c) and injection suppression region 9b contact the current spreading layer 3. The cross-sectional view seen from the A-A direction of FIG. 3 corresponds to FIG. 1. As shown in FIG. 3, the planar patterns of the insulated gate electrode structures (8, 9a), (8, 9c) and injection suppression region 9b are stripe shapes, which extend in parallel to one another. In other words, the bottom surface of the injection suppression region 9b contacts the contact protection region 4b along the extension direction of the planar pattern of the injection suppression region 9b. Furthermore, the p$^+$ gate protection regions 4a, 4c contact the bottom surfaces of the insulated gate electrode structures (8, 9a), (8, 9c) along the extension direction of the planar patterns of the insulated gate electrode structures (8, 9a), (8, 9c).

As shown in FIG. 1, an interlayer insulating film 10 is disposed on the gate electrodes 9a, 9c and injection suppression region 9b. The interlayer insulating film 10 can be a non-doped silicon oxide film (SiO$_2$ film), which is referred to as "NSG", that does not contain phosphorus (P) or boron (B). However, the interlayer insulating film 10 may be a silicon oxide film to which phosphorus has been added (PSG), a silicon oxide film to which boron has been added (BSG), a silicon oxide film to which boron and phosphorus have been added (BPSG), a silicon nitride film (Si$_3$N$_4$), or the like.

A barrier metal layer 11 serving as the base metal and a source contact layer 12 are disposed on the interlayer insulating film 10. The barrier metal layer 11 is metallurgically joined to the main electrode regions 6a, 6b, 6c, 6d, and extends from the main electrode regions 6a, 6b, 6c, 6d so as to cover the side surfaces and top surface of the interlayer insulating film 10. The source contact layer 12 is metallurgically joined to the main electrode regions 6a, 6b, 6c, 6d, and injection suppression region 9b. A low contact-resistance ohmic contact can be obtained by forming the source contact layer 12 of a nickel silicide (NiSi$_x$) film and the barrier metal layer 11 of a titanium nitride (TiN) film, for example. Either one or both of the source contact layer 12 and barrier metal layer 11 may be omitted.

One main electrode layer (source electrode) 13 is disposed on the source contact layer 12 and barrier metal layer 11. The main electrode layer 13 is electrically connected to the main electrode regions 6a, 6b, 6c, 6d and injection suppression region 9b. As can be understood from FIG. 1, the lowest surface of the main electrode layer 13 is metallurgically joined to the top surface of the main electrode regions 6a, 6b, 6c, 6d, and the top surface of the injection suppression region 9b, which is on a horizontal level that is equal to the top surface of the main electrode regions 6a, 6b, 6c, 6d. The main electrode layer 13 is disposed separated from a gate surface electrode (not shown) positioned in the depth of the sheet of drawing. The main electrode layer 13 can be made of a metal layer such as an aluminum (Al) film. The gate surface electrode can use the same material as the main electrode layer 13.

The n$^+$ other main electrode region (drain region) 1 is disposed on the bottom surface of the drift layer 2 so as to contact the drift layer 2. The drain region 1 is formed by a semiconductor substrate made of SiC (SiC substrate). The impurity concentration of the drain region 1 is, for example, not less than about $1 \times 10^{18}$ cm$^{-3}$ and not more than about $1 \times 10^{20}$ cm$^{-3}$.

The other main electrode layer (drain electrode) 14 is disposed on the bottom surface of the drain region 1. The main electrode layer 14 can be a conductor layer such as a single layer film made of gold (Au) or a metal film in which Al, nickel (Ni), and Au have been laminated in the stated order. A metal film such as molybdenum (Mo) or tungsten (W) or an alloy layer in which nickel (Ni) and titanium (Ti) have been deposited and caused to react with SiC may be further laminated on the bottommost layer of the main electrode layer 14 to form a conductor layer, for example.

In FIG. 1, a three-unit cell structure having the insulated gate electrode structures (8, 9a), (8, 9c) and injection suppression region 9b is shown as a cross section of main parts. However, the insulated gate semiconductor device according to Embodiment 1 can be configured to be a power semiconductor device (power device) that passes large currents by forming a multi-channel structure through alternately and periodically arraying a plurality of two-unit cell structures, each including an insulated gate electrode structure and an injection suppression region, for example. The insulated gate semiconductor device is not limited to a structure in which an insulated gate electrode structure and injection suppression region are arrayed alternately and periodically. Two of insulated gate electrode structures and one injection suppression region may be arrayed alternately and periodically, for example.

During operation of the insulated gate semiconductor device according to Embodiment 1, a positive voltage is applied to the main electrode layer 14, and a positive voltage that is at least the threshold is applied to the gate electrodes 9a, 9c. This forms an inversion layer (channel) on the gate electrode 9a, 9c side of the injection control regions 5a, 5b, 5c, 5d and turns the device to the ON state. During the ON state, the main current flows from the main electrode layer 14 to the main electrode layer 13 through the drain region 1, drift layer 2, current spreading layer 3, inversion layer of the injection control regions 5a, 5b, 5c, 5d, and main electrode regions 6a, 6b, 6c, 6d. The flow direction of the main current is defined by the flow of positive charges, but in practice the flow of electrons, which are the majority carriers, flow from the main electrode layer 13 to the main electrode layer 14.

Figure 4A:
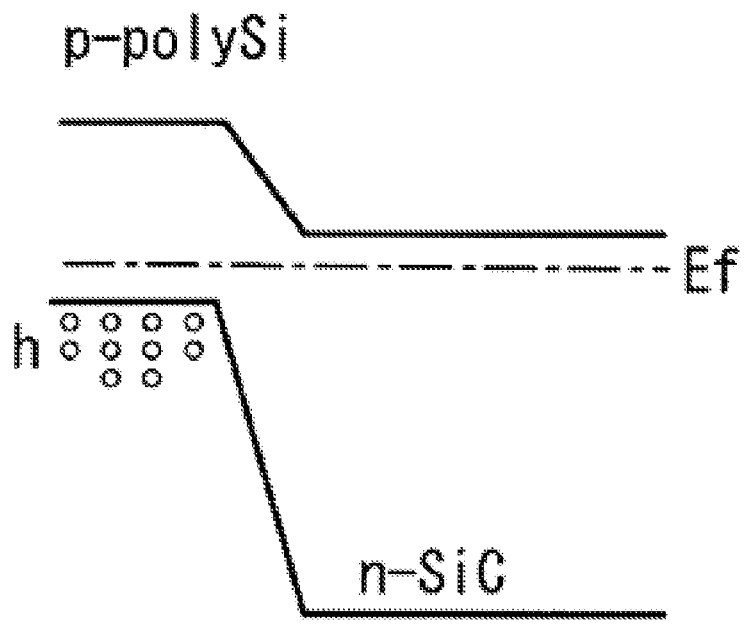
FIG. 4A is a schematic band diagram showing a p-n heterojunction during zero bias (balanced)

As already described, the insulated gate semiconductor device according to Embodiment 1 has a built-in diode (body diode) made of a p-n heterojunction, which is formed of the injection suppression region 9b made of the p$^+$ DOPOS layer and the n$^+$ current spreading layer 3. FIG. 4A is a schematic band diagram showing a p$^+$ DOPOS layer and an n-type SiC p-n heterojunction during zero bias (balanced), and FIG. 4B is a band diagram showing a state in which a negative voltage has been applied to the SiC side at the p-n heterojunction shown in FIG. 4A.

Figure 4B:
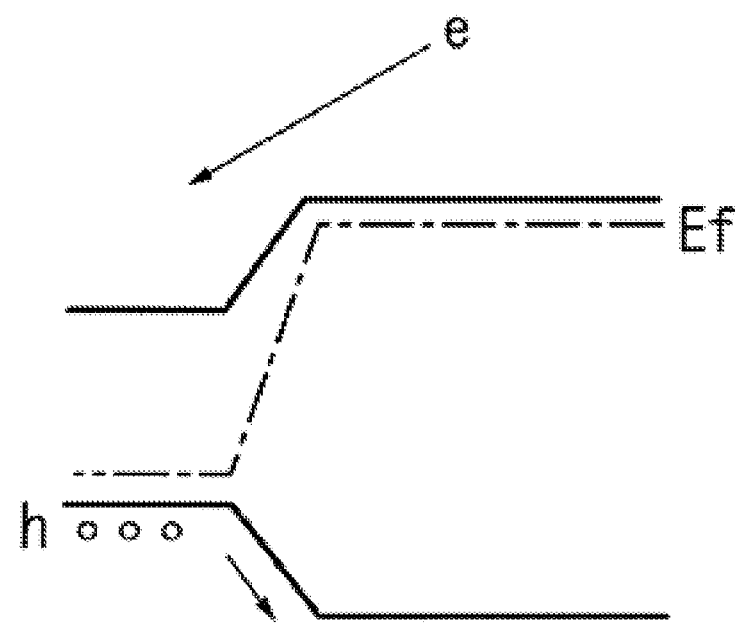
FIG. 4B is a band diagram showing a state in which a negative voltage has been applied to the wide bandgap side at the p-n heterojunction shown in FIG. 4A.

As shown in FIG. 4B, in the insulated gate semiconductor device according to Embodiment 1, even during the ON state in which a negative voltage has been applied to the n-type SiC side to obtain a forward bias, there still remains a low-potential barrier against low-energy holes. Due to this, it is possible to suppress inflow (injection) of holes, which are the minority carriers with respect to the current spreading layer 3, to the current spreading layer 3 caused by diffusion, and thus it is possible to suppress bipolar effects of the body diode. As a result, the insulated gate semiconductor device according to Embodiment 1 provides a low ON resistance and can suppress characteristic degradation caused by bipolar effects during the ON state. In other words, the insulated gate semiconductor device according to Embodiment 1 has a lower ON resistance than a body diode made of a Schottky diode and can thus lower power consumption and improve reliability.

Meanwhile, if the voltage applied to the gate electrodes 9a, 9c and injection suppression region 9b is below the threshold, then the inversion layer will not be formed on the surface of the injection control regions 5a, 5b, 5c, 5d, thus causing an OFF state, where the main current does not flow from the main electrode layer 14 to the main electrode layer 13. During this OFF state, the body diode made of the p-n heterojunction formed by the p+ injection suppression region 9b and n+ current spreading layer 3 is also in a cutoff state, and thus current does not flow to the body diode. As can be understood from FIG. 4B, in particular, during the cutoff state of the body diode, the potential barrier against holes is higher than the potential barrier in the case of a homojunction, thus making it possible to suppress the injection of holes.

Furthermore, the contact protection region 4b is disposed so as to contact the bottom surface of the injection suppression region 9b. This makes it possible to suppress a voltage from being applied to the injection suppression region 9b made of polysilicon or the like, which has a low electric field strength, and thus makes it possible to maintain a high withstand voltage and improve reliability.

Next, a method of manufacturing the insulated gate semiconductor device according to Embodiment 1 will be described with reference to FIGS. 5 to 16 while using the case of a trench gate MISFET as one example. The method of manufacturing the trench gate MISFET described below is one example, and various other types of methods of manufacturing can be performed, including this modification example, within the scope set forth in the claims.

Figure 5:
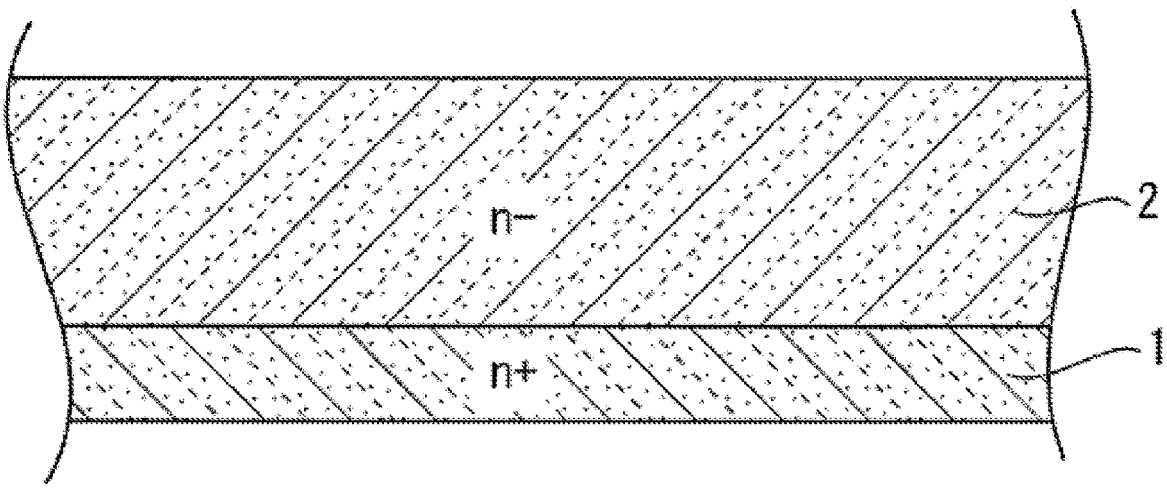
FIG. 5 is a cross-sectional view of a step for describing one example of a method of manufacturing the insulated gate semiconductor device according to Embodiment 1.
Figure 6:
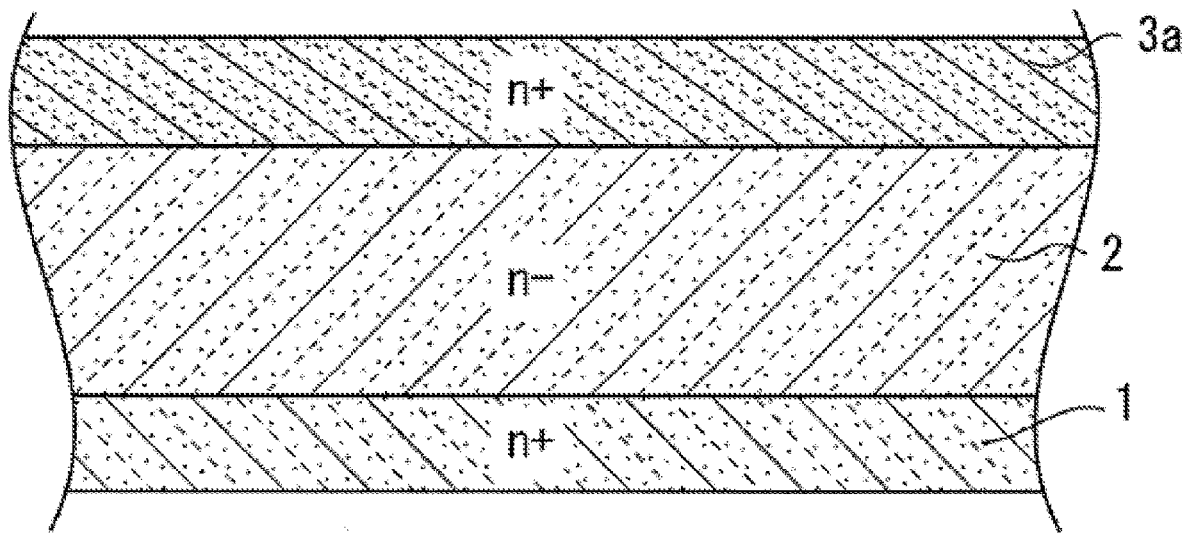
FIG. 6 is a cross-sectional view of a step after FIG. 5 for describing one example of the method of manufacturing the insulated gate semiconductor device according to Embodiment 1.

First, an n+ semiconductor substrate (SiC substrate) to which an n-type impurity such as nitrogen (N) has been added is prepared. As shown in FIG. 5, with this n+ SiC substrate as the drain region 1, the n− drift layer 2 is epitaxially grown on the top surface of the drain region 1. Next, multiple-stage ion implantation is performed on the top surface of the drift layer 2 with n-type impurity ions such as nitrogen (N). Thereafter, a heat treatment is performed to activate the n-type impurity ions, and an n+ first current spreading layer 3a is formed, as shown in FIG. 6. The first current spreading layer 3a may be epitaxially grown on the top surface of the drift layer 2.

Figure 7:
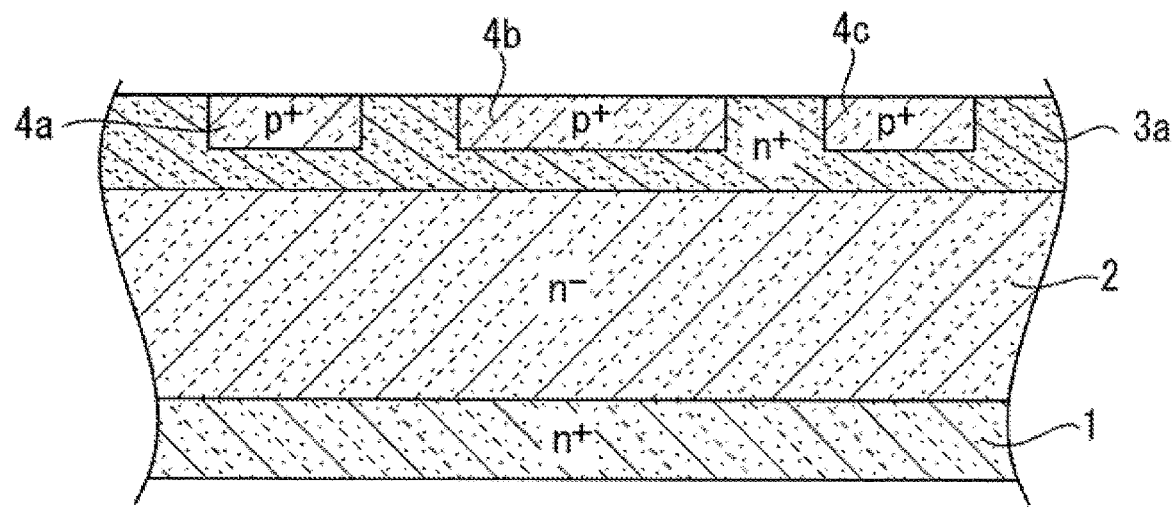
FIG. 7 is a cross-sectional view of a step after FIG. 6 for describing one example of the method of manufacturing the insulated gate semiconductor device according to Embodiment 1.

Next, a photoresist film is coated on the top surface of the first current spreading layer 3a, and photolithography is used to pattern the photoresist film. The patterned photoresist film is used as an ion implantation mask to perform multiple-stage ion implantation of p-type impurity ions such as Al. After the ion implantation mask is removed, a heat treatment is performed to activate the p-type impurity ions. As a result, as shown in FIG. 7, the p+ gate protection regions 4a, 4c and p+ contact protection region 4b are selectively formed in the top part of the first current spreading layer 3a.

Figure 8:
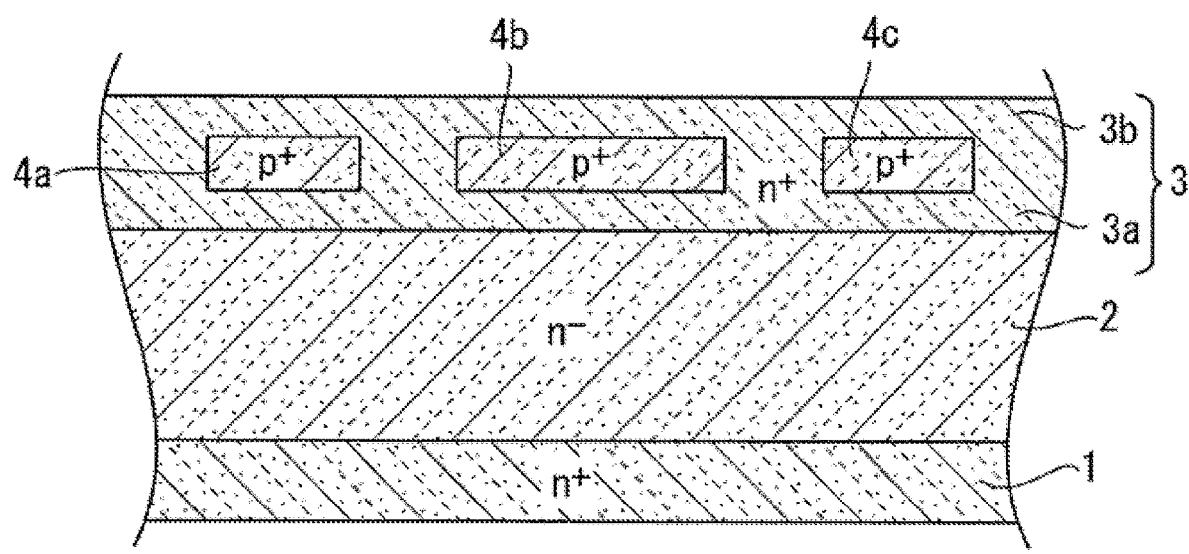
FIG. 8 is a cross-sectional view of a step after FIG. 7 for describing one example of the method of manufacturing the insulated gate semiconductor device according to Embodiment 1.

Next, as shown in FIG. 8, an n+ second current spreading layer 3b is epitaxially grown on the top surface of the first current spreading layer 3a at the same impurity concentration as the first current spreading layer 3a, so that the first current spreading layer 3a and second current spreading layer 3b form the current spreading layer 3.

Figure 9:
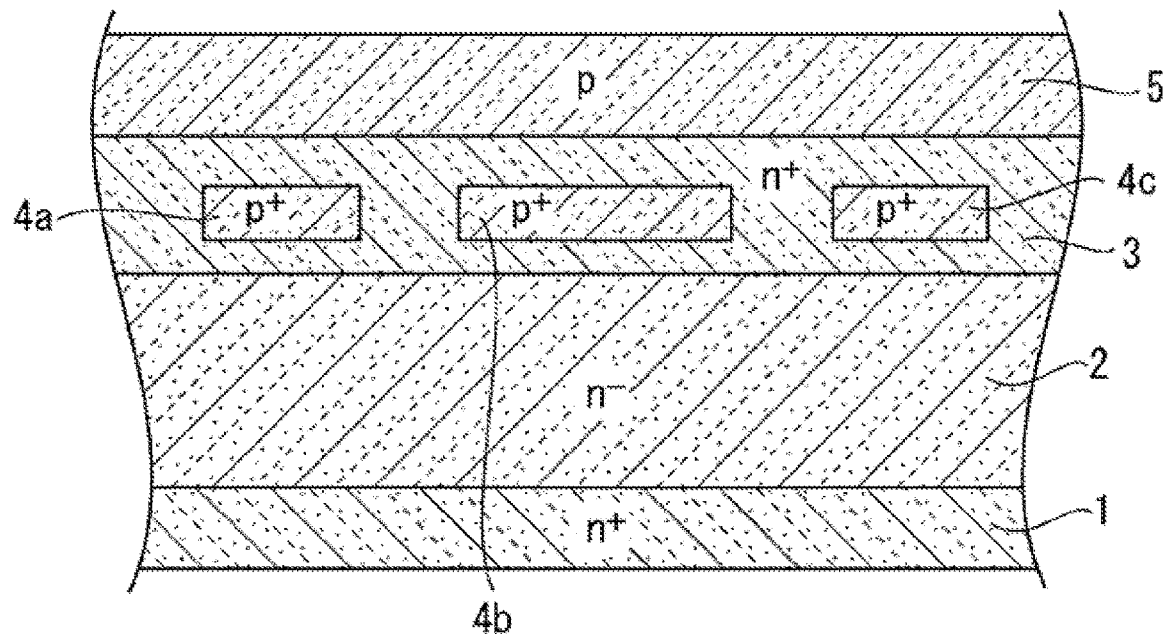
FIG. 9 is a cross-sectional view of a step after FIG. 8 for describing one example of the method of manufacturing the insulated gate semiconductor device according to Embodiment 1.
Figure 10:
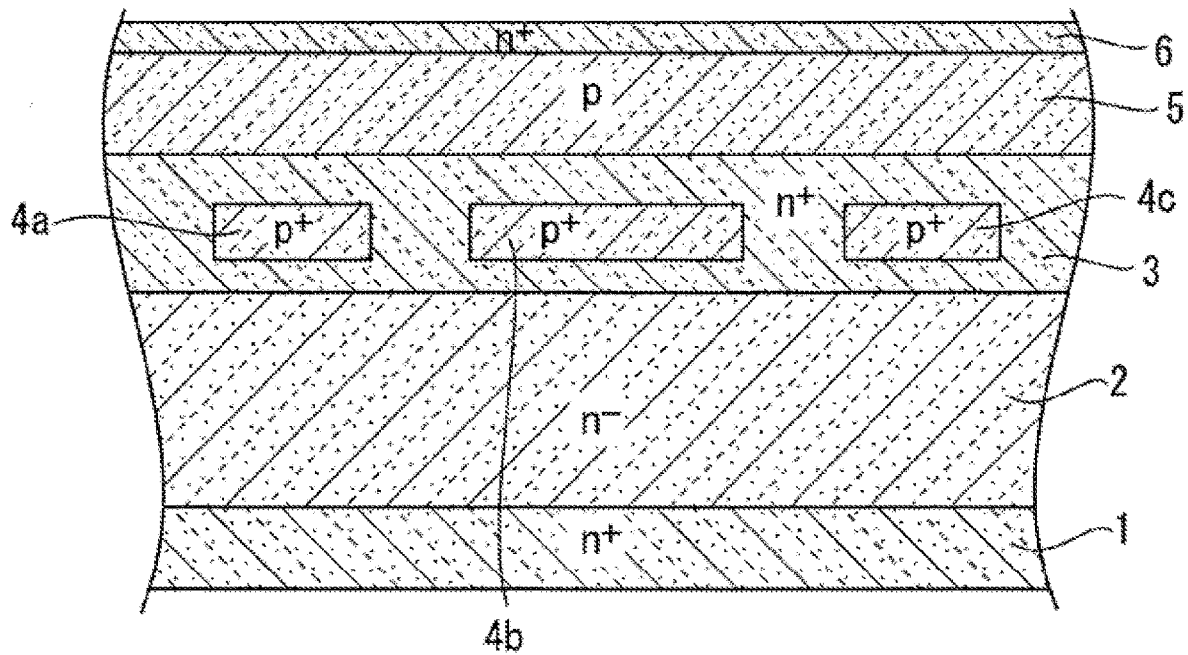
FIG. 10 is a cross-sectional view of a step after FIG. 9 for describing one example of the method of manufacturing the insulated gate semiconductor device according to Embodiment 1.

Next, as shown in FIG. 9, a p-type injection control region 5 is epitaxially grown on the top surface of the current spreading layer 3. Next, multiple-stage ion implantation is performed on the entire top surface of the injection control region 5 with n-type impurity ions such as N. Thereafter, a heat treatment is performed to activate the implanted n-type impurity ions. As a result, as shown in FIG. 10, the n+ main electrode region 6 is formed on the top surface of the injection control region 5. The main electrode region 6 may be epitaxially grown on the top surface of the injection control region 5.

Figure 11:
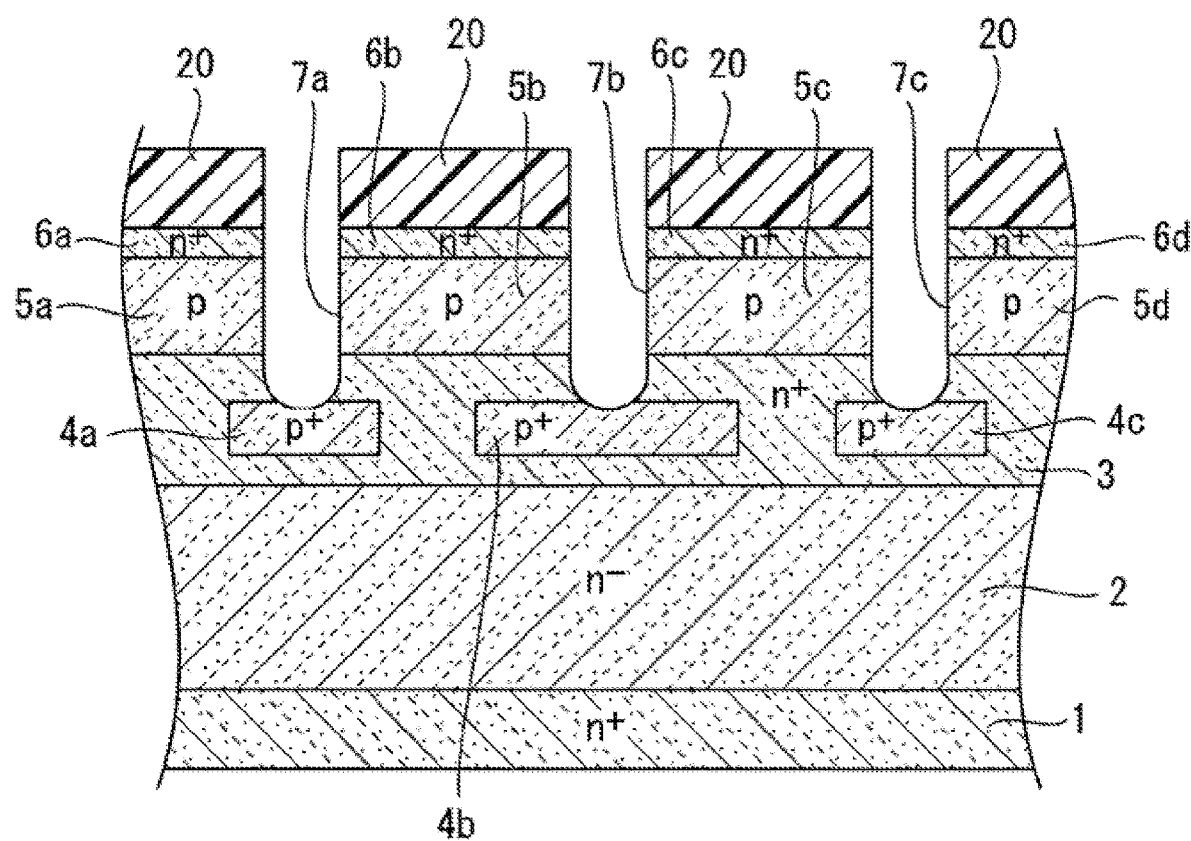
FIG. 11 is a cross-sectional view of a step after FIG. 10 for describing one example of the method of manufacturing the insulated gate semiconductor device according to Embodiment 1.

Next, a photoresist film 20 is coated on the top surface of the main electrode region 6, and photolithography is used to pattern the photoresist film 20. The patterned photoresist film 20 is used as an etching mask and dry etching or the like such as reactive ion etching (RIE) is performed to simultaneously form the gate trenches 7a, 7c, and contact trench 7b, as shown in FIG. 11. By forming the gate trenches 7a, 7c, and contact trench 7b at a depth that goes through the injection control region 5 and main electrode region 6, the injection control region 5 shown in FIG. 10 is separated into the injection control regions 5a, 5b, 5c, 5d shown in FIG. 11. At the same time, the main electrode region 6 shown in FIG. 10 is separated into the main electrode regions 6a, 6b, 6c, 6d shown in FIG. 11. In other words, the gate trenches 7a, 7c, and contact trench 7b go through the main electrode regions 6a, 6b, 6c, 6d and injection control regions 5a, 5b, 5c, 5d, and reach the top part of the current spreading layer 3. Thereafter, the photoresist film 20 is removed.

Figure 12:
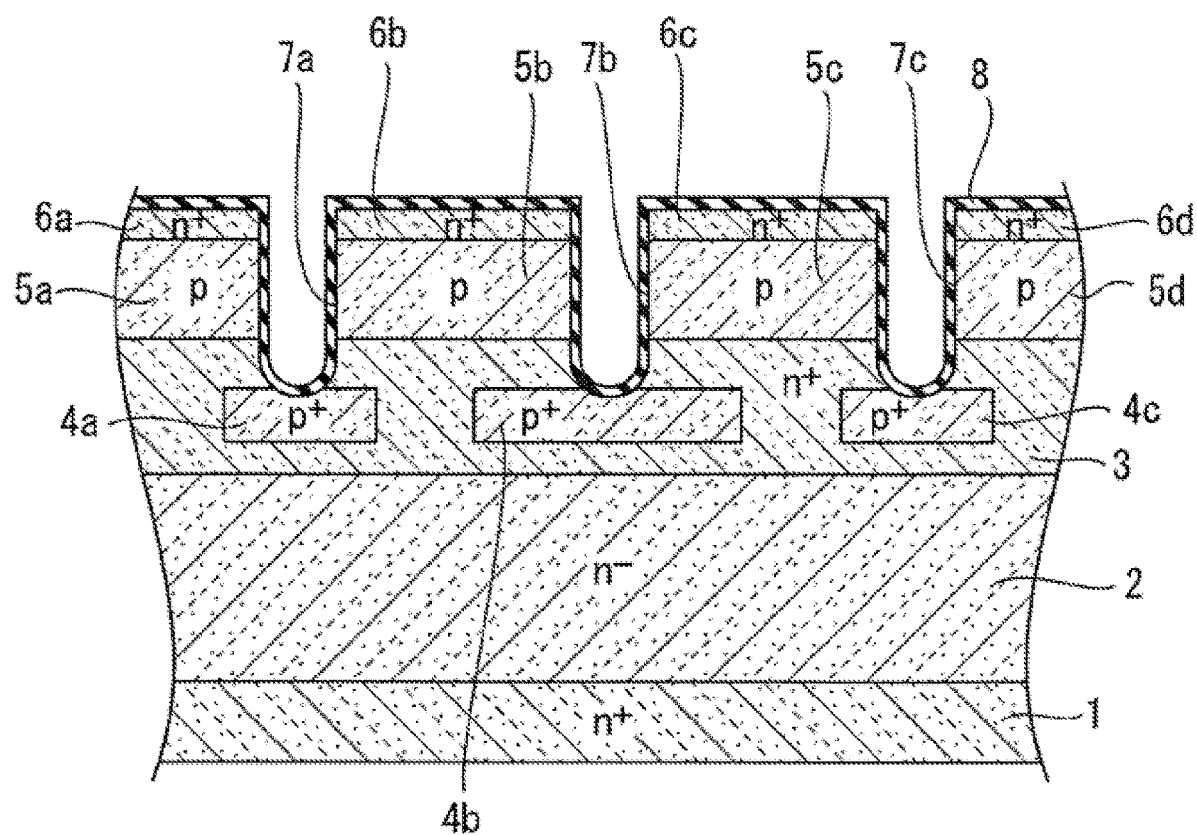
FIG. 12 is a cross-sectional view of a step after FIG. 11 for describing one example of the method of manufacturing the insulated gate semiconductor device according to Embodiment 1.
Figure 13:
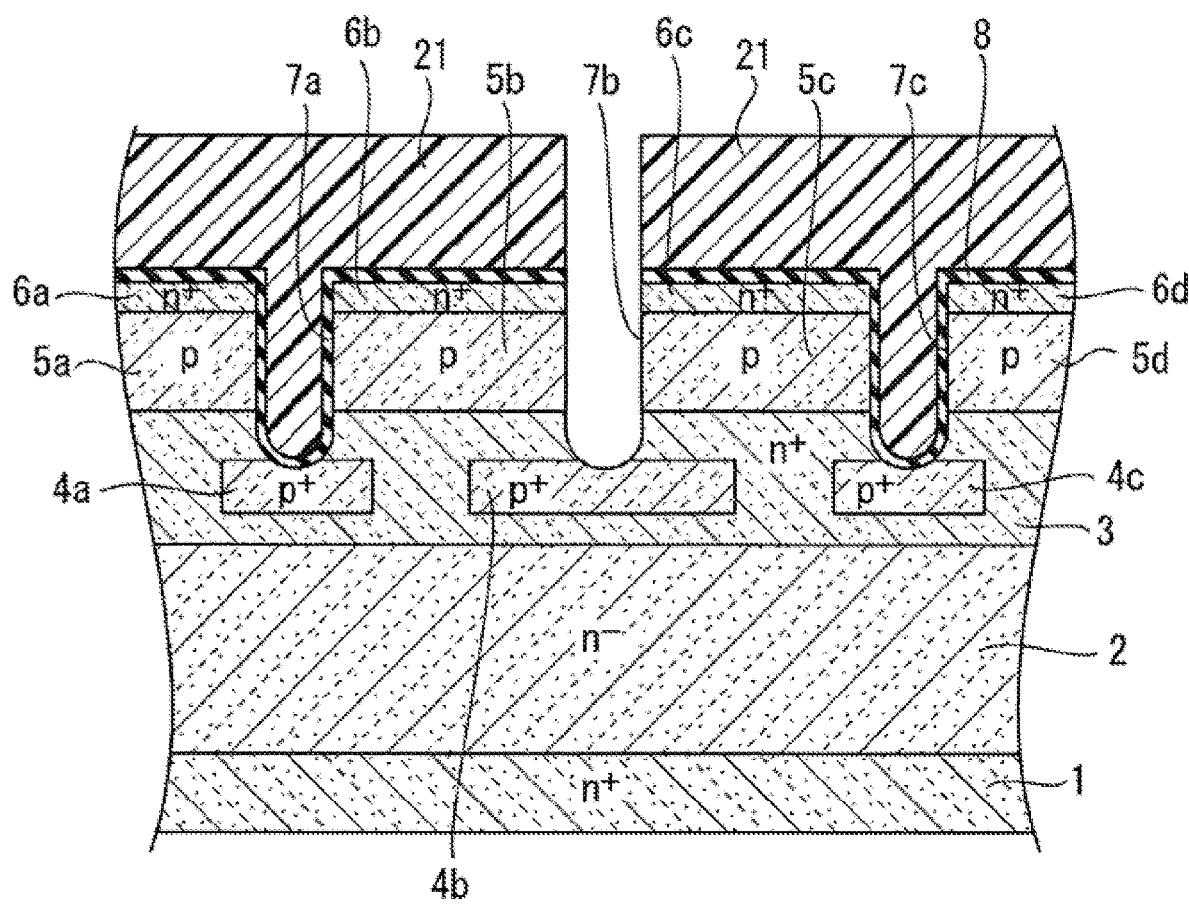
FIG. 13 is a cross-sectional view of a step after FIG. 12 for describing one example of the method of manufacturing the insulated gate semiconductor device according to Embodiment 1.

Next, as shown in FIG. 12, thermal oxidation, chemical vapor deposition (CVD), or the like is used to form the gate insulating film 8 such as an $SiO_2$ film on the bottom surface and side surfaces of the gate trenches 7a, 7c and contact trench 7b, and on the top surface of the main electrode regions 6a, 6b, 6c, 6d. Next, a photoresist film 21 is coated onto the bottom surface and side surfaces of the gate trenches 7a, 7c and contact trench 7b, and onto the top surface of the main electrode regions 6a, 6b, 6c, 6d, and then photolithography is used to pattern the photoresist film 21. The patterned photoresist film 21 is used as an etching mask and wet etching or the like is performed to remove the gate insulating film 8 on the bottom surface and side surfaces of the trench 7b. As a result, the bottom surface and side surfaces of the trench 7b are exposed as shown in FIG. 13. Thereafter, the photoresist film 21 is removed.

Figure 14:
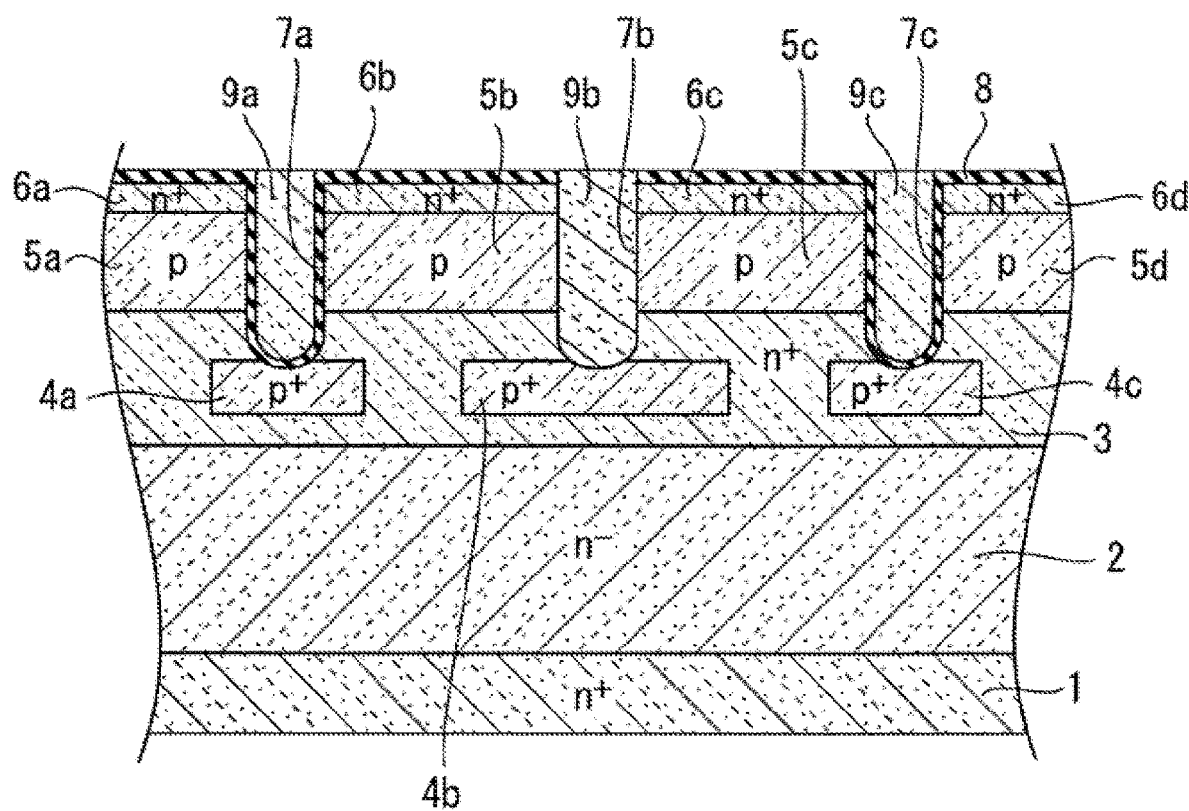
FIG. 14 is a cross-sectional view of a step after FIG. 13 for describing one example of the method of manufacturing the insulated gate semiconductor device according to Embodiment 1.

Next, CVD or the like is used to deposit a polysilicon layer (doped polysilicon layer), to which a p-type impurity has been added at a high concentration, at a thickness whereby the recesses in the gate trenches 7a, 7c and contact trench 7b are filled. Thereafter, a technique such as etchback or chemical mechanical polishing (CMP) is used to planarize the front surface, thereby simultaneously filling the gate trenches 7a, 7c and contact trench 7b respectively with the gate electrodes 9a, 9c and injection suppression region 9b made of the DOPOS layer, as shown in FIG. 14.

Figure 15:
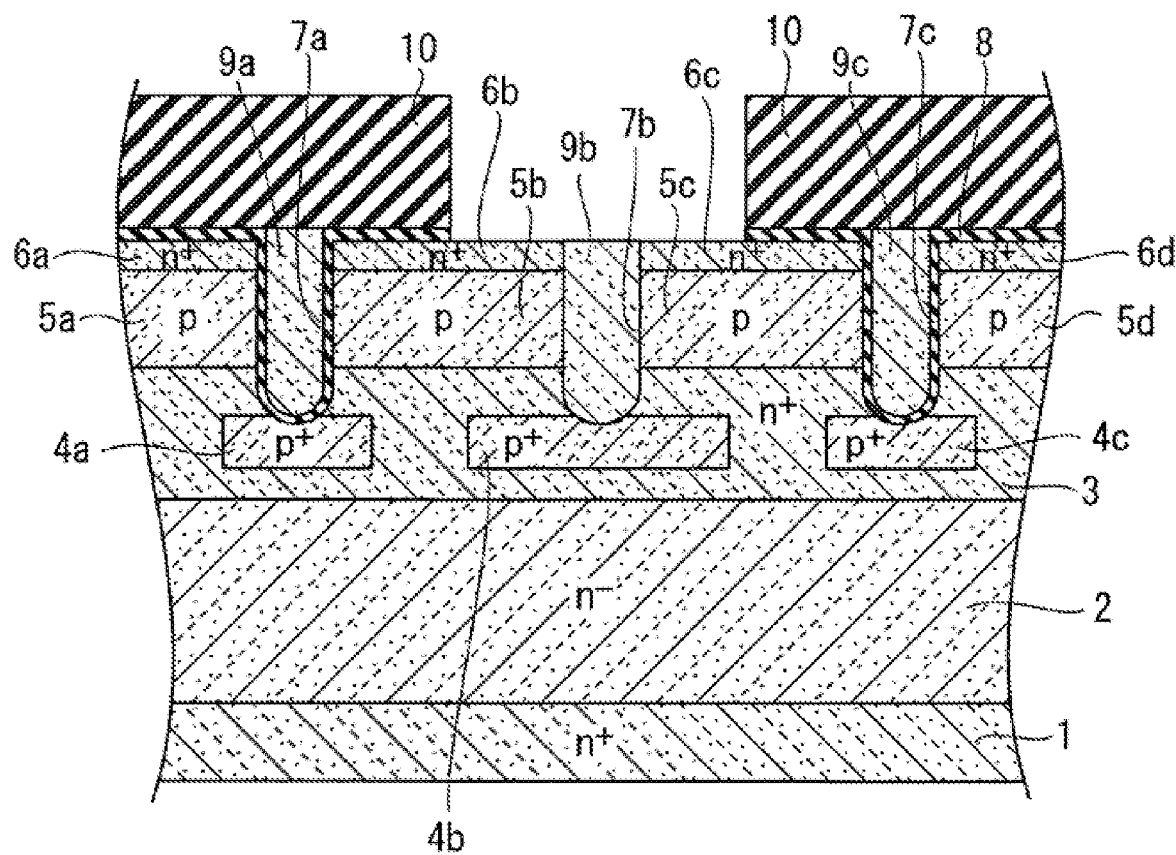
FIG. 15 is a cross-sectional view of a step after FIG. 14 for describing one example of the method of manufacturing the insulated gate semiconductor device according to Embodiment 1.

Next, CVD or the like is used to deposit the interlayer insulating film 10 on the top surface of the gate electrodes 9a, 9c and injection suppression region 9b. As shown in FIG. 15, photolithography and dry etching are used to selectively remove a portion of the interlayer insulating film 10 and gate insulating film 8. As a result, a source contact hole is opened in the interlayer insulating film 10 and gate insulating film 8. Although not shown in the drawings, a gate contact hole is also opened in the interlayer insulating film 10 and gate insulating film 8 at a location differing from the source contact hole (e.g., a position in the depth of the sheet of the drawing) so as to expose a portion of the gate electrodes 9a, 9c. If the structure has gate surface wiring connected to the gate electrodes 9a, 9c, then the gate contact hole may be opened in the interlayer insulating film 10 and gate insulating film 8 such that a portion of the gate surface wiring is exposed at a position in the depth of the sheet of the drawing, at a position on the front side of the sheet of the drawing, or the like.

Figure 16:
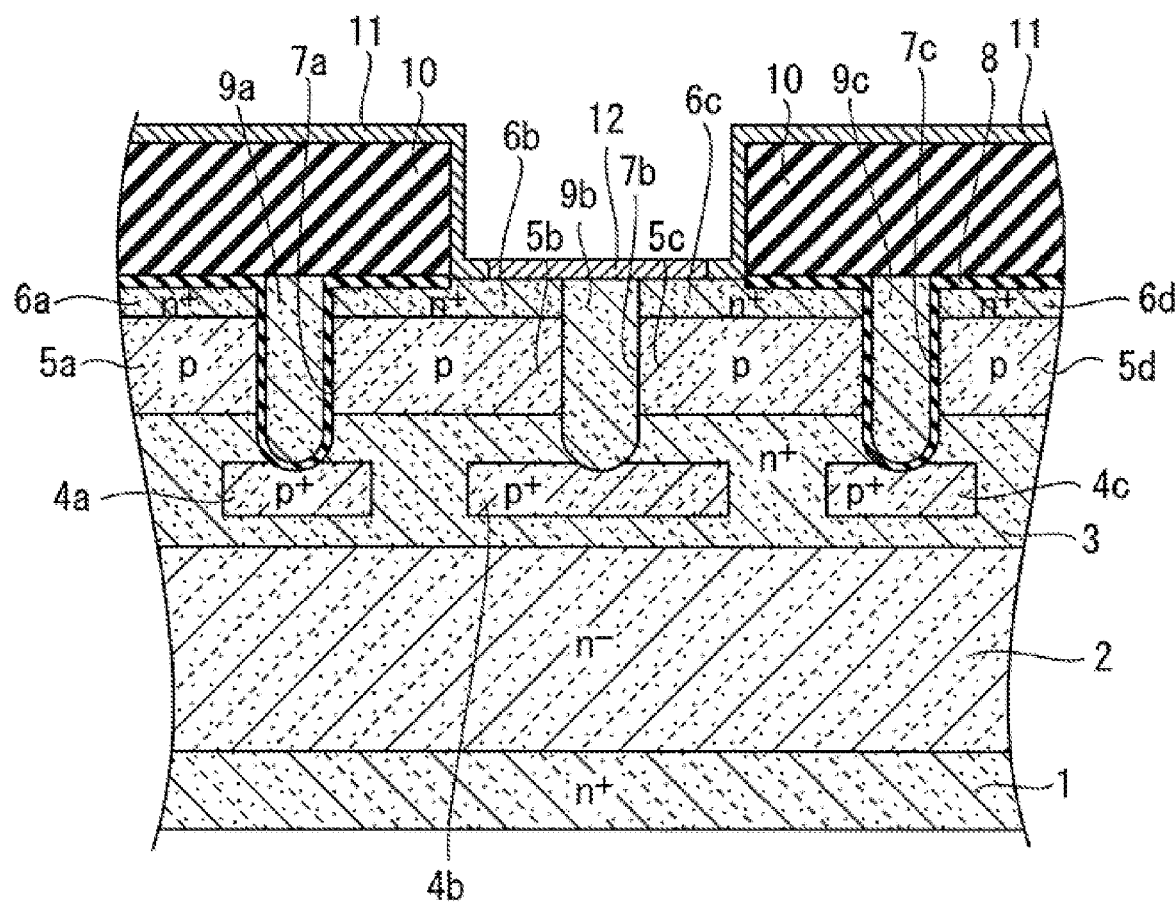
FIG. 16 is a cross-sectional view of a step after FIG. 15 for describing one example of the method of manufacturing the insulated gate semiconductor device according to Embodiment 1.

Next, sputtering or vapor deposition or the like is used to deposit a metal layer such as a TiN film, and photolithography and RIE etc. are used to pattern the metal layer and form the barrier metal layer 11. Next, sputtering or vapor deposition or the like is used to deposit a metal layer such as an Ni film, photolithography and RIE etc. are used to pattern the metal layer, and then a high-speed heat treatment (RTA) is performed at 1000° C., for example, in order to form the source contact layer 12. As a result, as shown in FIG. 16, the barrier metal layer 11 is formed to cover the interlayer insulating film 10, and the source contact layer 12 is formed on the top surface of the injection suppression region 9b and main electrode regions 6b, 6c.

Figure 17:
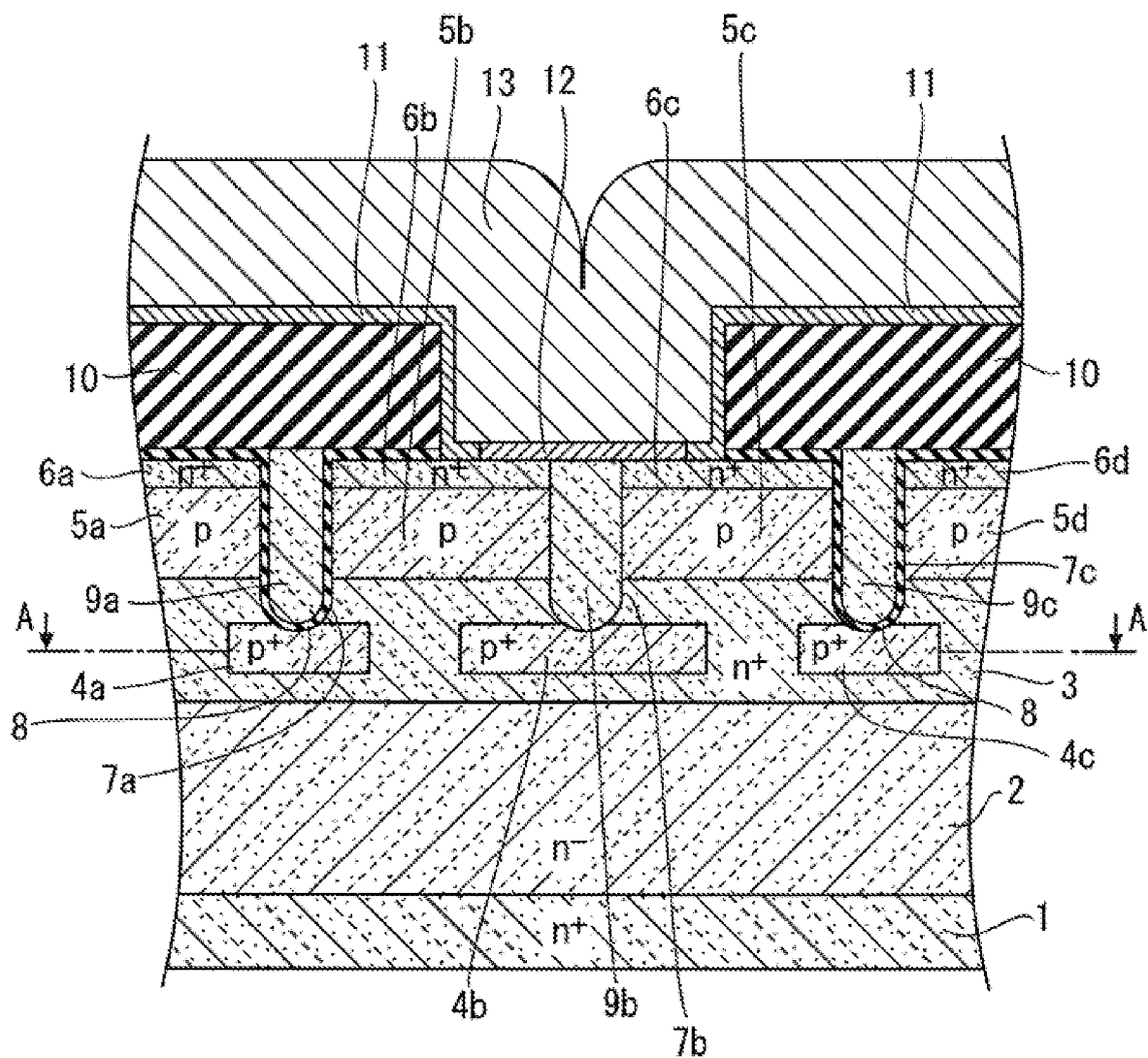
FIG. 17 is a cross-sectional view of a step after FIG. 16 for describing one example of the method of manufacturing the insulated gate semiconductor device according to Embodiment 1.

Next, sputtering or vapor deposition or the like is used to deposit a metal layer such as an Al film on the top surface of the source contact layer 12. Photolithography and RIE or the like are used to pattern the metal layer such as an Al film to form the pattern of the main electrode layer 13 and gate surface electrode (not shown), as shown in FIG. 17. As a result, the pattern of the main electrode layer 13 and the gate surface electrode are separated. Next, sputtering or evaporation etc. is used to form the main electrode layer 14 made of Au or the like on the entire bottom surface of the drain region 1. This completes the insulated gate semiconductor device shown in FIG. 1.

According to the method of manufacturing the insulated gate semiconductor device according to Embodiment 1, the gate trenches 7a, 7c and contact trench 7b are formed at the same time, and the gate electrodes 9a, 9c and injection suppression region 9b are formed at the same time, thereby making it possible to easily realize, in a small number of manufacturing steps, a built-in diode that has a high withstand voltage and with which reliability can be improved.

Embodiment 2

Figure 18:
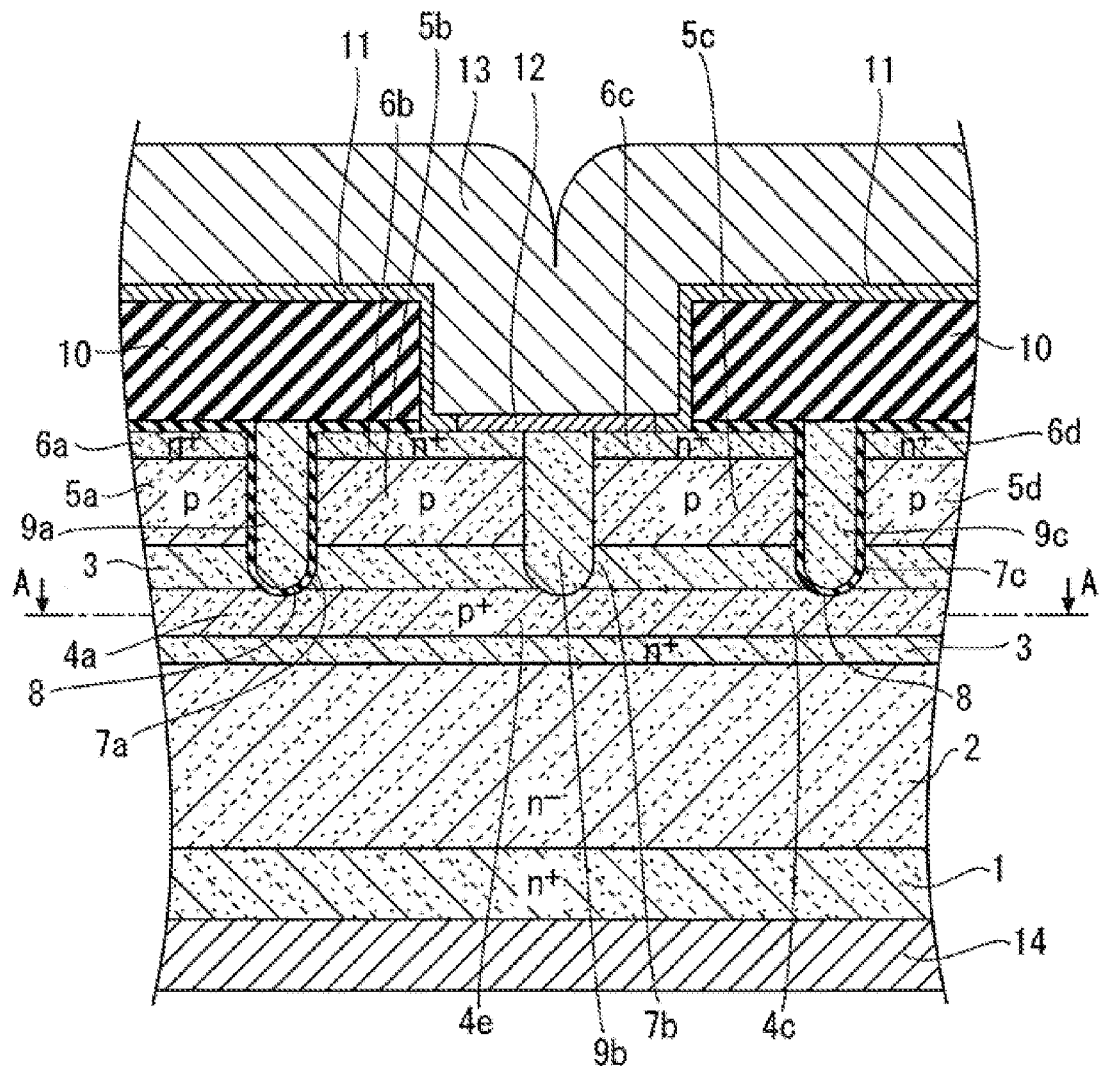
FIG. 18 is a cross-sectional view of main parts of one example of an insulated gate semiconductor device according to Embodiment 2 of the present invention.

An insulated gate semiconductor device according to Embodiment 2 of the present invention differs from the insulated gate semiconductor device according to Embodiment 1 shown in FIG. 1 etc. in that, in the cross-sectional structure shown in FIG. 18, the contact protection region 4b contacting the bottom surface of the injection suppression region 9b, and the gate protection regions 4a, 4c contacting the bottom surface of the gate electrodes 9a, 9c are continuous with one another and form a uniform layer.

Figure 19:
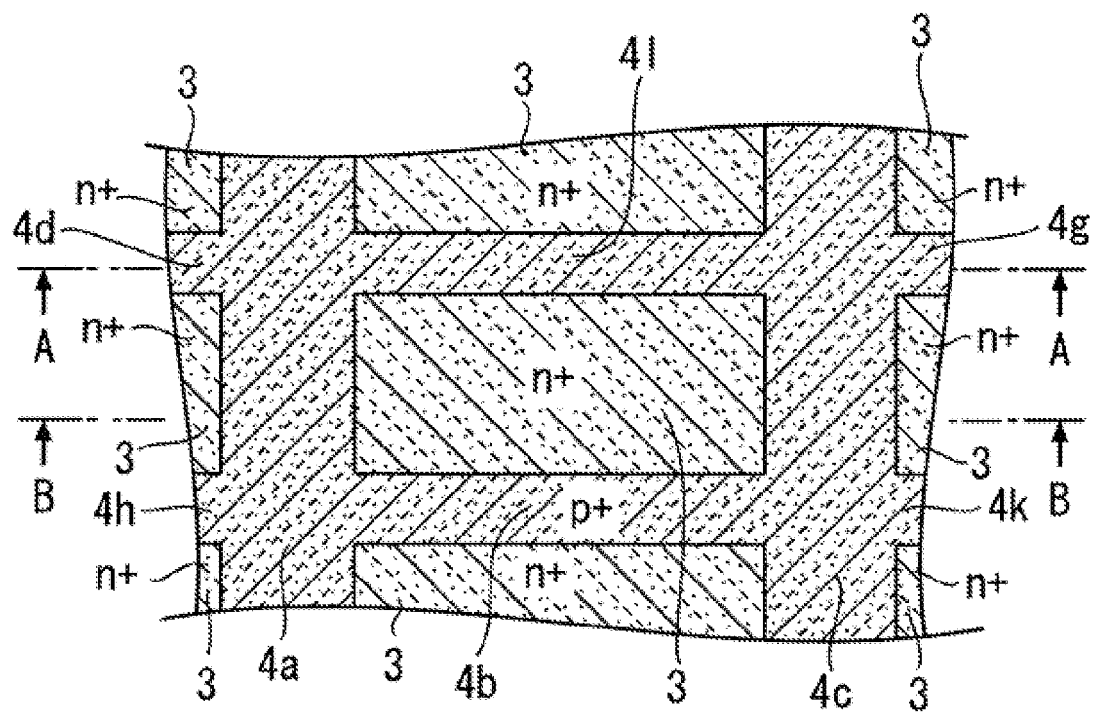
FIG. 19 is a cross-sectional view in the horizontal direction of the insulated gate semiconductor device seen from the A-A direction of FIG. 18.

FIG. 19 shows a planar layout seen from the A-A direction horizontally cutting through the uniform layer where the gate protection regions 4a, 4c and contact protection region 4b are continuous with one another in FIG. 18. The cross-sectional view in the vertical direction seen from the A-A direction of FIG. 19 corresponds to FIG. 18. As shown in FIG. 19, the gate protection regions 4a, 4c extend in parallel to each other as stripe-shaped patterns extending in the vertical direction.

Disposed on the left-side position of a vertical-direction pattern formed by the gate protection region 4a are p+ connection regions 4d, 4h connected as protrusions from the gate protection region 4a pattern, thus forming a grid pattern. P+ contact protection regions 4b, 4l are disposed between the gate protection regions 4a, 4c. The contact protection regions 4b, 4l extend in parallel to one another as stripe-shaped patterns extending in the lateral direction and are connected to the gate protection regions 4a, 4c so as to form a grid pattern (a checkered pattern). Disposed on the right-side position of a vertical-direction pattern formed by the gate protection region 4c are p+ connection regions 4g, 4k connected as protrusions from the gate protection region 4c pattern, thus forming a grid pattern.

Figure 20:
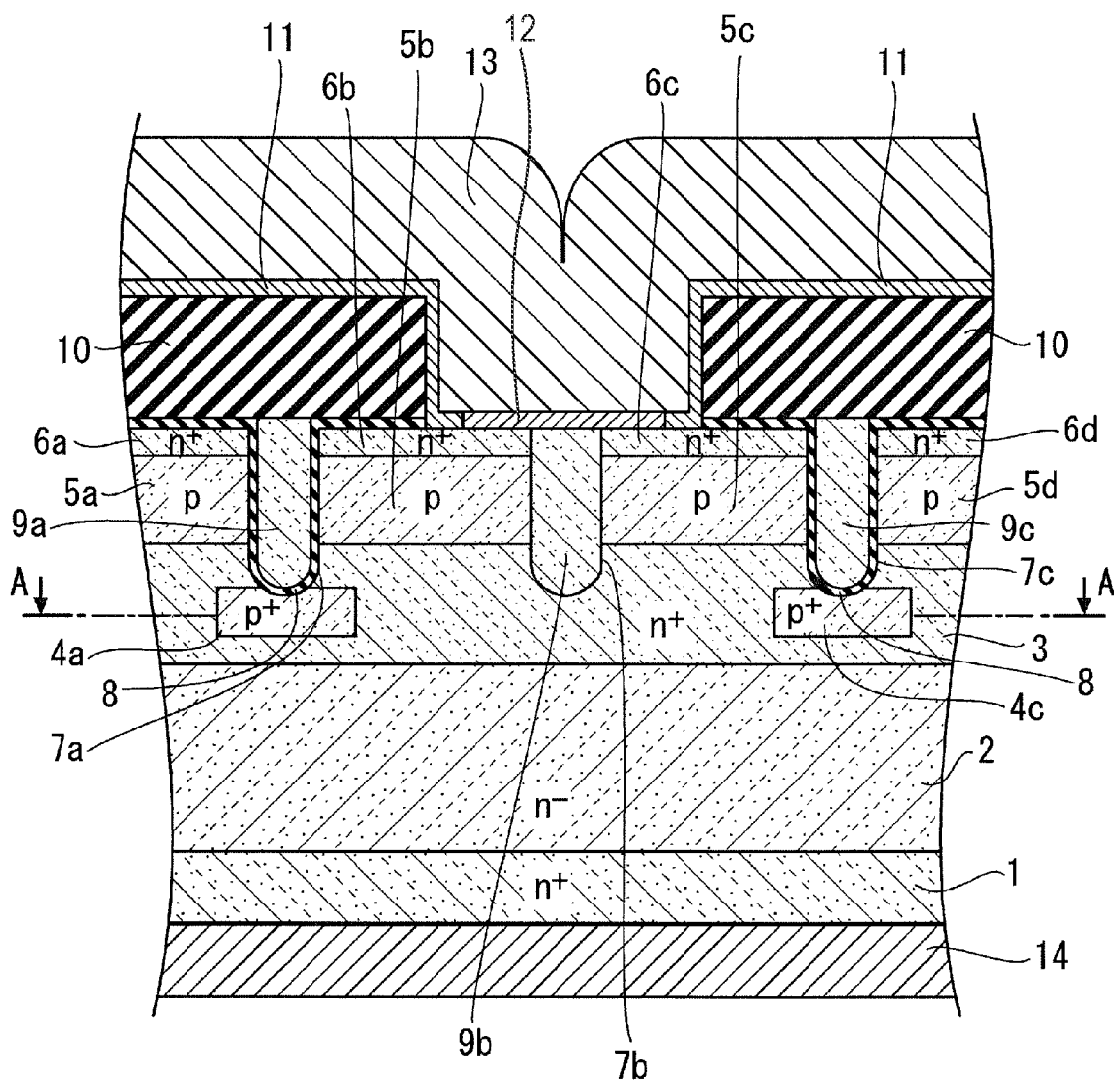
FIG. 20 is a cross-sectional view in the vertical direction of the insulated gate semiconductor device seen from the B-B direction of FIG. 19.

In the grid (checkered) pattern in FIG. 19, the cross-sectional view in the vertical direction seen from the B-B direction going through the current spreading layer 3 corresponds to FIG. 20. In the cross section shown in FIG. 20, the bottom surface of the injection suppression region 9b contacts the current spreading layer 3. The other configurations of the insulated gate semiconductor device according to Embodiment 2 are the same as the insulated gate semiconductor device according to Embodiment 1.

The planar patterns of the insulated gate electrode structures (8, 9a), (8, 9c) and injection suppression region 9b shown in FIG. 18 are the same as those of Embodiment 1, i.e., are stripe shapes and extend in parallel to one another as shown in FIG. 3. The contact protection regions 4b, 4l shown in FIG. 19 contact the bottom surface of the injection suppression region 9b shown in FIG. 18.

In the insulated gate semiconductor device according to Embodiment 2, as shown in FIGS. 18 to 20, the contact protection regions 4b, 4l do not contact the entire bottom surface of the injection suppression region 9b in the lengthwise direction of the injection suppression region 9b, but rather intermittently contact a portion of the bottom surface of the injection suppression region 9b, and even with this structure, it is possible to protect the bottom of the injection suppression region 9b from electric fields.

Embodiment 3

Figure 21:
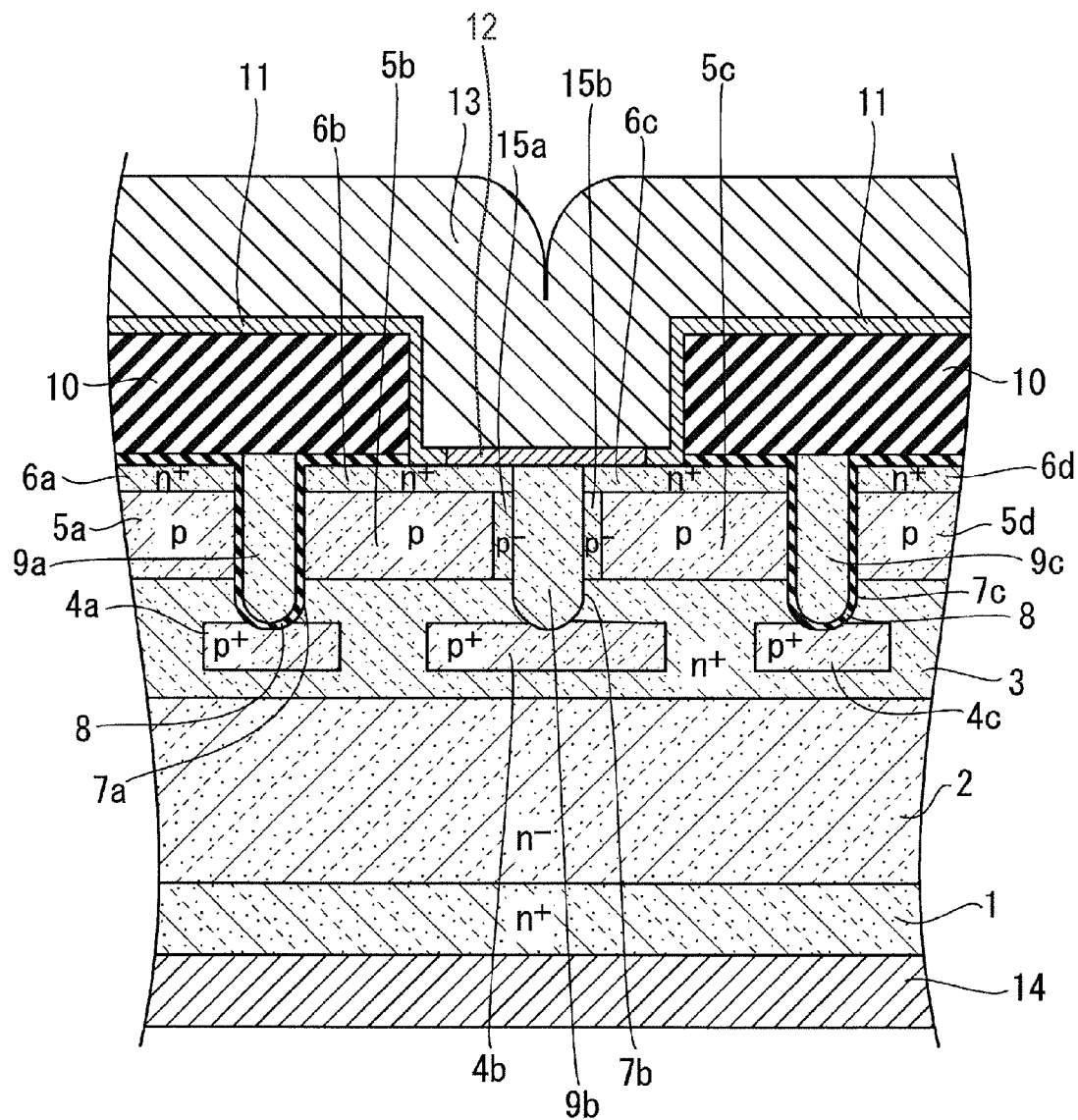
FIG. 21 is a cross-sectional view of main parts of one example of an insulated gate semiconductor device according to Embodiment 3 of the present invention.

As shown in FIG. 21, the insulated gate semiconductor device according to Embodiment 3 of the present invention differs from the insulated gate semiconductor device according to Embodiment 1 in further including cover regions 15a, 15b provided between the injection suppression region 9b and injection control regions 5b, 5c in a sheath shape surrounding the injection suppression region 9b. The cover regions 15a, 15b are made of second conductivity type (p⁻) SiC of a lower concentration than the injection control regions 5b, 5c. The other configurations of the insulated gate semiconductor device according to Embodiment 3 are the same as the insulated gate semiconductor device according to Embodiment 1.

In the insulated gate semiconductor device according to Embodiment 1 shown in FIG. 1, the width of the injection suppression region 9b is narrow, and thus the current path narrows and resistance increases. In contrast, in the insulated gate semiconductor device according to Embodiment 3, a p-p heterojunction is formed between the cover regions 15a, 15b made of p⁻ SiC and the injection suppression region 9b made of the p⁺ DOPOS layer. The p-p heterojunction reduces the difference between the Si valence band Ev and Fermi level Ef, and the difference between the SiC valence band Ev and Fermi level Ef. In other words, the p-p heterojunction causes the SiC conduction band Ec to be pulled up in the vacuum level direction even on the p-n heterojunction side shown in FIG. 4B. Thus, the barrier against electrons becomes smaller to increase the injection efficiency of electrons, and it is possible to reduce resistance.

During manufacturing of the insulated gate semiconductor device according to Embodiment 3, the gate trenches 7a, 7c, and contact trench 7b are formed simultaneously as shown in FIG. 11 in the same manner as the manufacturing process for the insulated gate semiconductor device according to Embodiment 1, for example. After the etching mask has been formed, multiple-stage ion implantation is performed on the sidewalls of the contact trench 7b with n-type impurity ions from an oblique direction. Thereafter, the p⁻ cover regions 15a, 15b can be formed with a heat treatment.

Alternatively, after the trenches are formed in the injection control region 5 shown in FIG. 9 to separate the region into the injection control region 5b and injection control region 5c, a p⁻ semiconductor region may be epitaxially grown from between the injection control region 5b and the injection control region 5c. In a case where embedded epitaxial growth is performed for the p semiconductor region, the top surface may be planarized and then the contact trench 7b going through the p⁻ semiconductor region may be dug to form the p⁻ cover regions 15a, 15b on both sides in a sheath shape.

Instead of the p⁻ cover regions 15a, 15b, n⁻ semiconductor sheath regions may be provided at a concentration where depletion occurs on the SiC side. An n⁻-p heterojunction would be formed between the sheath regions made of n⁻ SiC and the injection suppression region 9b made of the p⁺ DOPOS layer. The n⁻-p heterojunction would reduce the difference between the Si valence band Ev and Fermi level Ef, and the difference between the SiC valence band Ev and Fermi level Ef even more than the case of the n-p heterojunction shown in FIG. 4A. In other words, the n⁻-p heterojunction also causes the SiC conduction band Ec to be pulled up in the vacuum level direction on the p-n heterojunction side shown in FIG. 4B. Thus, the barrier against electrons becomes smaller to increase the injection efficiency of electrons, and it is possible to reduce resistance. In this case as well, forming may be performed with a multiple-stage ion implantation on the sidewalls of the contact trench 7b with n-type impurity ions from an oblique direction and then a heat treatment, or forming may be performed with embedded epitaxial growth. Resistance may be reduced by widening the current path by making the width of the contact trench 7b wider than the width of the gate trenches 7a, 7c.

Embodiment 4

Figure 22:
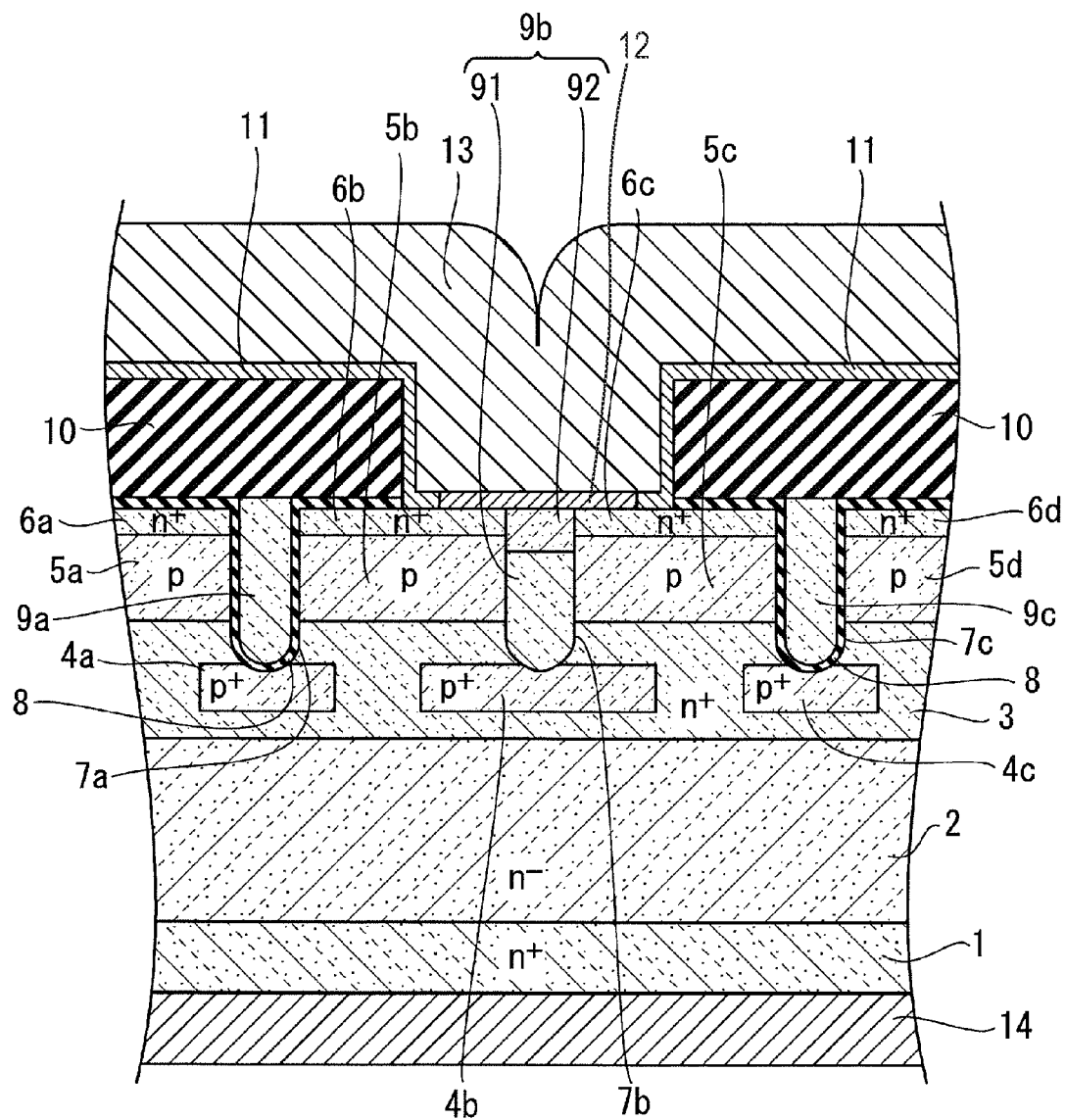
FIG. 22 is a cross-sectional view of main parts of one example of an insulated gate semiconductor device according to Embodiment 4 of the present invention.

As shown in FIG. 22, the insulated gate semiconductor device according to Embodiment 4 of the present invention differs from the insulated gate semiconductor device according to Embodiment 1 in the structure of the injection suppression region 9b. The injection suppression region 9b includes a first conductivity type (n⁺) first inflow suppression section 91 provided in a bottom part of the contact trench 7b, and a second conductivity type (p⁺) second inflow suppression section 92 provided in the top part of the contact trench 7b and contacting the first inflow suppression section 91. The first inflow suppression section 91 and the second inflow suppression section 92 are each made of a semiconductor with a narrower bandgap than the current spreading layer 3, and an n-n heterojunction is formed by the first inflow suppression section 91 and the current spreading layer 3. Furthermore, a p-p heterojunction is formed by the second inflow suppression section 92 and the injection control regions 5b, 5c.

The first inflow suppression section 91 can be made of an n-type semiconductor with a higher concentration than the p-type injection control regions 5b, 5c. The first inflow suppression section 91 is made of a DOPOS layer to which an n-type impurity such as nitrogen (N), phosphorus (P), or arsenic (As) has been added at a high concentration. The first inflow suppression section 91 forms a heterojunction with the current spreading layer 3. In Embodiment 4, a pn junction diode is formed by the n⁺ first inflow suppression section 91, and the second inflow suppression section 92 made of the p⁺ DOPOS layer. The gate electrodes 9a, 9c and first inflow suppression section 91 may use the same material as one another. The other configurations of the insulated gate semiconductor device according to Embodiment 4 are the same as the insulated gate semiconductor device according to Embodiment 1.

In the insulated gate semiconductor device according to Embodiment 1 shown in FIG. 1, the width of the injection suppression region 9b is narrow, and thus the current path narrows and it is conceivable that resistance will increase. In contrast, according to the insulated gate semiconductor device according to Embodiment 4, an n-n heterojunction is formed between the current spreading layer 3 made of the n-type SiC and the first inflow suppression section 91 made of the n⁺ DOPOS layer. The n-n heterojunction would reduce the difference between the Si conduction band Ec and Fermi level Ef, and the difference between the SiC conduction band Ec and Fermi level Ef even more than the case of the n-p heterojunction shown in FIG. 4A. In other words, the n-n heterojunction causes the SiC conduction band Ec to be pulled up in the vacuum level direction and thus the barrier against electrons becomes smaller, the injection efficiency of electrons becomes higher, and the potential barrier on the valence band side becomes larger; therefore, it is possible to suppress the injection of minority carriers (holes).

During manufacturing of the insulated gate semiconductor device according to Embodiment 4 of the present invention, the gate trenches 7a, 7c, and contact trench 7b are formed simultaneously in the same manner as the manufacturing process for the insulated gate semiconductor device according to Embodiment 1, for example. Thereafter, the gate trenches 7a, 7c, and contact trench 7b are embedded simultaneously with the gate electrodes 9a, 9c, and first inflow suppression section 91. Thereafter, p-type impurity ions may be ion implanted into the top surface of the first inflow suppression section 91, and a heat treatment may be performed to form the second inflow suppression section 92 on the top part of the first inflow suppression section 91. Alternatively, etch-back or the like may be used to selectively remove the top part of the first inflow suppression section 91, and then the second inflow suppression section 92 may be embedded by CVD or the like.

OTHER EMBODIMENTS

The present invention was described using Embodiments 1 to 4 above, but the descriptions and drawings forming this part of the disclosure should not be construed as limiting the present invention. Various substitute embodiments, examples, and applied techniques should be clear to a person skilled in the art based on this disclosure.

Figure 23:
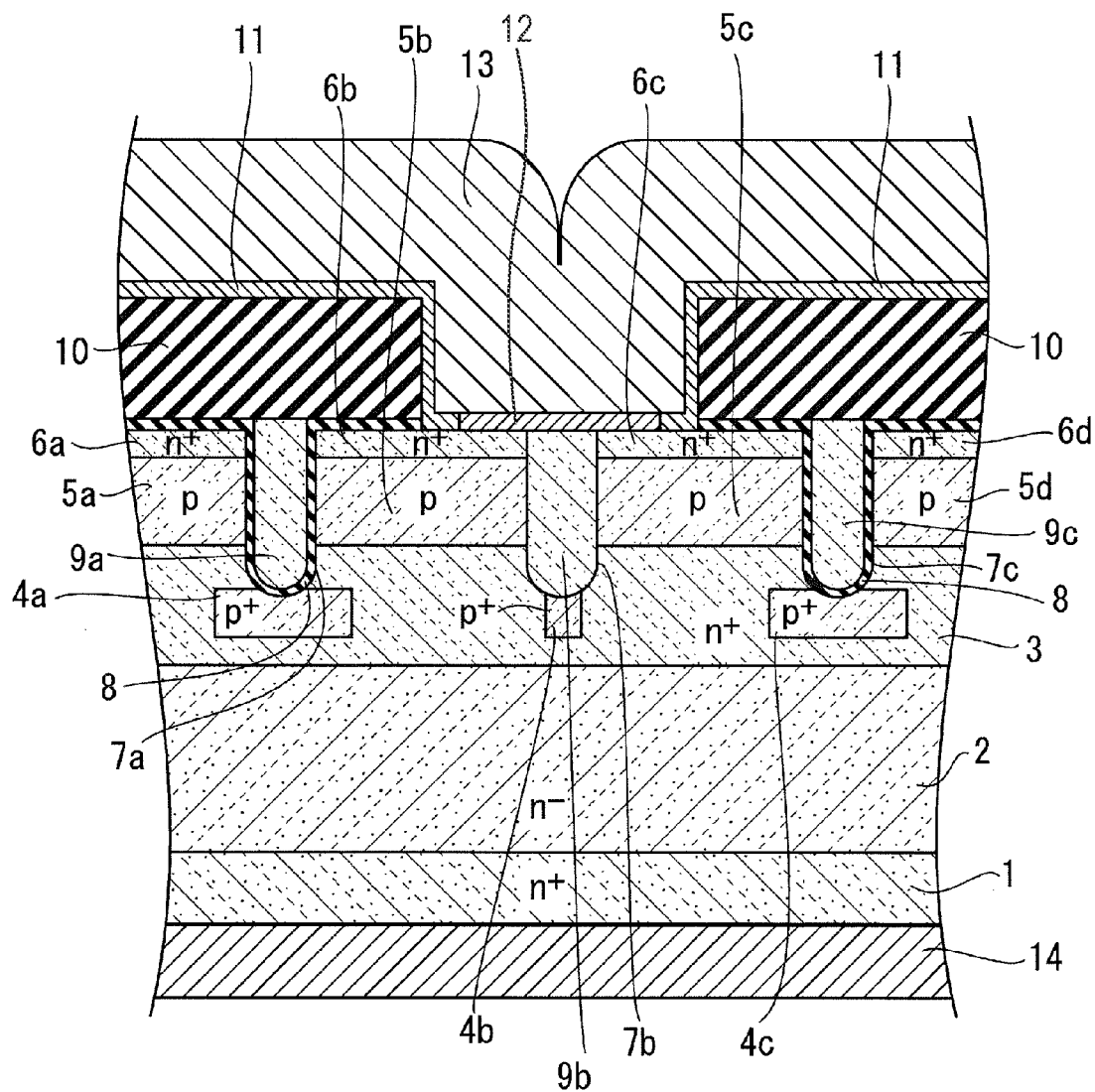
FIG. 23 is a cross-sectional view of main parts of one example of an insulated gate semiconductor device according to another embodiment of the present invention.

For example, as shown in FIG. 23, the contact protection region 4b contacting the bottom surface of the injection suppression region 9b does not need to contact the entire bottom surface of the injection suppression region 9b. In other words, the contact protection region 4b may be provided so as to contact at least a portion of the bottom surface of the injection suppression region 9b.

Figure 24:
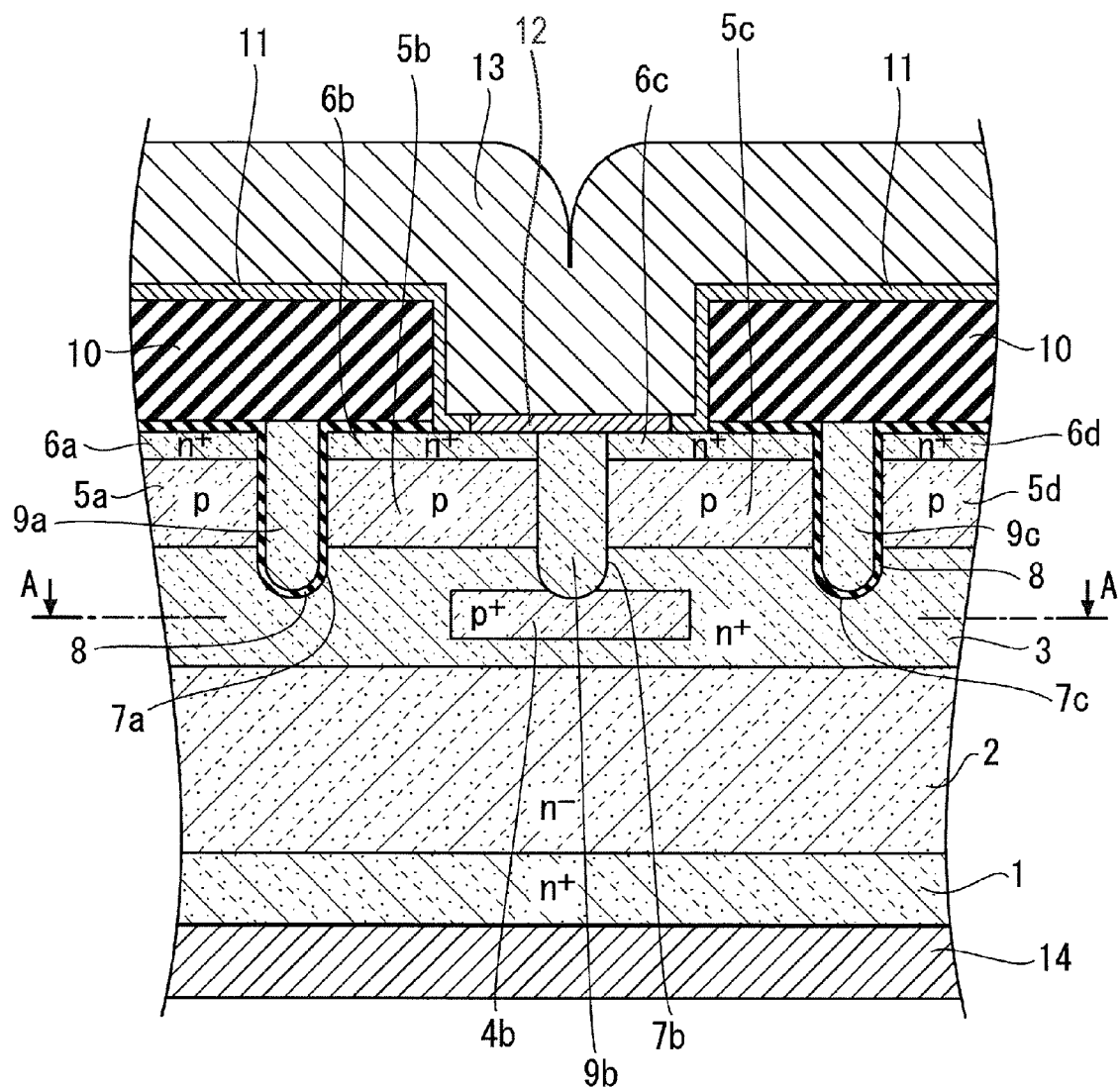
FIG. 24 is a cross-sectional view of main parts of one example of an insulated gate semiconductor device according to another embodiment of the present invention.
Figure 25:
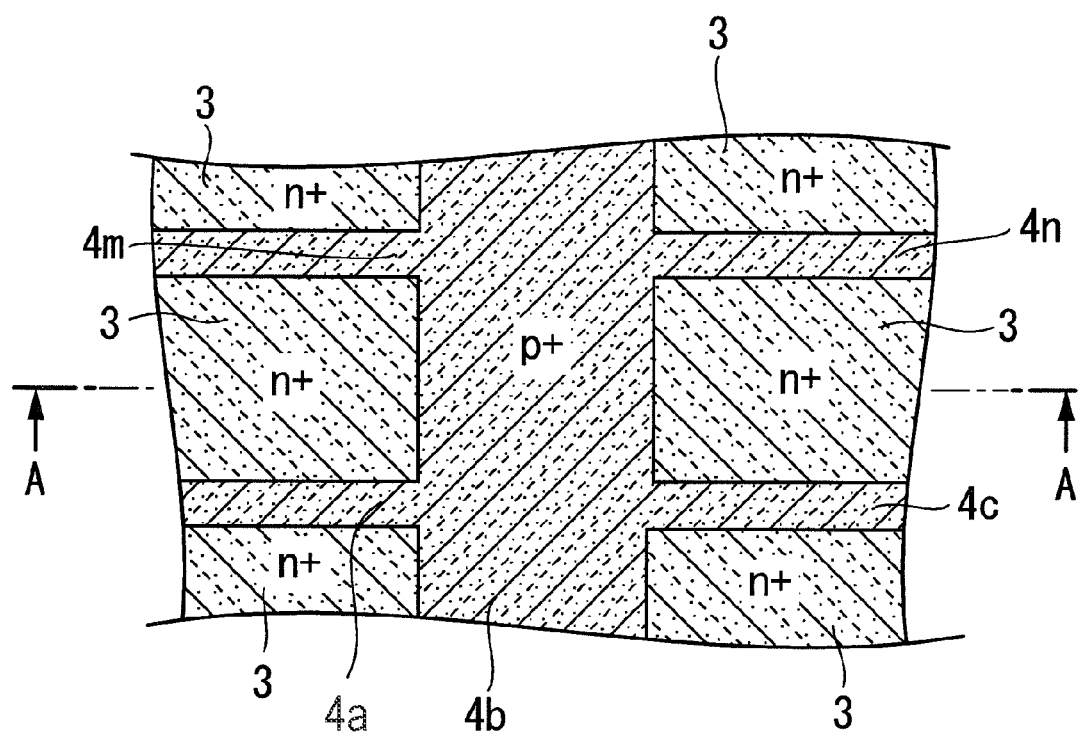
FIG. 25 is a cross-sectional view in the horizontal direction of the insulated gate semiconductor device seen from the A-A direction of FIG. 24.

Furthermore, as shown in FIG. 24, the bottom surface of the insulated gate electrode structures (8, 9a), (8, 9c) may contact the current spreading layer 3. FIG. 25 shows a planar layout seen from the A-A direction horizontally cutting through the contact protection region 4b. The cross-sectional view in the vertical direction seen from the A-A direction of FIG. 25 corresponds to FIG. 24. As shown in FIG. 25, the contact protection region 4b extends as a stripe-shaped pattern extending in the vertical direction.

Disposed on the left-side position of a vertical-direction pattern formed by the contact protection region 4b are p+ gate protection regions 4a, 4m. The gate protection regions 4a, 4m extend in parallel to one another as stripe-shaped patterns extending in the lateral direction and are connected to the contact protection region 4b so as to form a grid pattern (a checkered pattern). Disposed on the right-side position of a vertical-direction pattern formed by the contact protection region 4b are p+ gate protection regions 4c, 4n. The gate protection regions 4c, 4n extend in parallel to one another as stripe-shaped patterns extending in the lateral direction and are connected to the contact protection region 4b so as to form a grid pattern (a checkered pattern).

The planar patterns of the insulated gate electrode structures (8, 9a), (8, 9c), and injection suppression region 9b shown in FIG. 24 are stripe shapes and extend in parallel to one another as shown in FIG. 3. The gate protection regions 4a, 4m shown in FIG. 25 contact the bottom surface of the insulated gate electrode structure (8, 9a) shown in FIG. 24. In other words, the gate protection regions 4a, 4m intermittently contact a portion of the bottom surface of the insulated gate electrode structure (8, 9a) in the lengthwise direction of the planar pattern of the insulated gate electrode structure (8, 9a) shown in FIG. 24. Furthermore, the gate protection regions 4c, 4n shown in FIG. 25 contact the bottom surface of the insulated gate electrode structure (8, 9b) shown in FIG. 24. In other words, the gate protection regions 4c, 4n intermittently contact a portion of the bottom surface of the insulated gate electrode structure (8, 9b) in the lengthwise direction of the planar pattern of the insulated gate electrode structure (8, 9b) shown in FIG. 24.

In Embodiments 1 to 4, examples were shown where the bottom surface of the gate trenches 7a, 7c and the bottom surface of the contact trench 7b were curved, but the bottom surfaces of the gate trenches 7a, 7c and contact trench 7b may be flat. Examples were shown where the planar pattern of the gate trenches 7a, 7c and the planar pattern of the contact trench 7b are arrayed in stripe shapes, but the planar patterns may be rectangular, or the planar patterns may be a polygon such as a hexagon.

Furthermore, in Embodiments 1 to 4, a MISFET having a trench gate structure was shown as examples, but the present invention is not limited to this and is applicable to an insulated gate semiconductor device having various types of trench gate structures, such as an IGBT having a trench gate structure. In an IGBT having a trench gate structure, the n+ main electrode region 6a, 6b, 6c, 6d of the MISFET shown in FIG. 1 may be the emitter regions, and a p+ collector region may be provided on the bottom surface side of the drift layer 2 instead of the n+ drain region 1.

In Embodiments 1 to 4, an insulated gate semiconductor device using SiC was shown as examples, but the present invention may also be applied to an insulated gate semiconductor device that uses a different wide bandgap semiconductor, such as gallium nitride (GaN), diamond, or aluminum nitride (AlN). The present invention is also not limited to a wide bandgap semiconductor and can, in principle, be applied even to an insulated gate semiconductor device using silicon (Si) as long as a narrow bandgap semiconductor such as Ge or indium antimony (InSb) is used as the semiconductor material of the injection suppression region.

In the explanation of the insulated gate semiconductor device according to Embodiments 1 to 4, a structure was shown as examples in which a collector region 1 serving as the other main electrode region and a collector electrode 14 electrically or metallurgically connected to this collector region 1 were on the rear surface (bottom surface). However, as in the case of a power IC, if a deep sinker region or the like that connects to the collector region 1 is used, then it is also possible to provide the collector electrode 14 serving as the other main electrode on the top surface side of the charge transport region (2, 3) while maintaining a vertical structure. In a case where a sinker region or the like is used, it is also unnecessary to provide the collector region 1 on the entire surface of the bottom part of the charge transport region, and the collector region can be embedded in a region in a part of the charge transport region.

In the case of a power IC, if a sinker region is used, then the sinker region can also be made to function as the other main electrode region, and furthermore, a new collector region (second collection region) serving as a new "other main electrode region" may be added to the top part of the charge transport region (2, 3). Alternatively, a deep through-hole going through the charge transport region may be provided in the periphery of a chip, and DOPOS or a refractory metal may be embedded inside this through-hole to form a through-silicon via (TSV), and the other main electrode may be provided on the top surface side thereof. The TSV may be formed by diffusing impurities in the sidewalls of the through-hole.

Thus, it goes without saying that the present invention includes various embodiments, etc. not disclosed here. Accordingly, the technical scope of the present invention is determined solely by the invention-defining features within a reasonable scope of the claims from the descriptions above.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A method of manufacturing an insulated gate semiconductor device, the method comprising:

forming an injection control region made of a first semiconductor material of a second conductivity type on a charge transport region made of the first semiconductor material of a first conductivity type;

forming a main electrode contact region made of the first semiconductor material of the first conductivity type on the injection control region at a higher impurity concentration than the charge transport region;

simultaneously forming a gate trench and a contact trench that respectively penetrate form a top of the electrode contact region through the main electrode contact region and the injection control region in a depth direction and respectively reach the charge transport region, the contact trench being disposed at a position laterally separated from the gate trench in a plan view;

forming a gate insulating film inside the gate trench;

embedding a gate electrode inside the gate trench with the gate insulating film interposed therebetween, thereby forming an insulated gate structure, and simultaneously embedding an injection suppression region inside the contact trench, the gate electrode and the injection suppression region being both made of a second semiconductor material having a narrower bandgap than a bandgap of the first semiconductor material of the charge transport region; and forming a main electrode layer on a top surface of the main electrode contact region and on a top surface of the injection suppression region, wherein a section that is a part of the injection suppression region made of the second semiconductor material having the narrower bandgap is of the second conductivity type and is directly in contact with the charge transport region so as to form a pn heterojunction with the charge transport region.

2. The method of manufacturing the insulated gate semiconductor device according to claim 1, further comprising selectively forming a contact protection region of the second conductivity type at a higher impurity concentration than the injection control region inside the charge transport region so as to contact at least a portion of a bottom of the injection suppression region made of the second semiconductor material having the narrower bandgap.

* * * * *